(12) United States Patent
Chen et al.

(10) Patent No.: US 12,255,116 B2
(45) Date of Patent: Mar. 18, 2025

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Ming-Fa Chen, Taichung (TW); Ta-Hao Sung, Yilan County (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 310 days.

(21) Appl. No.: 17/702,820

(22) Filed: Mar. 24, 2022

(65) Prior Publication Data
US 2023/0307306 A1 Sep. 28, 2023

(51) Int. Cl.
*H01L 23/31* (2006.01)
*H01L 21/56* (2006.01)
(Continued)

(52) U.S. Cl.
CPC ........ *H01L 23/3185* (2013.01); *H01L 21/568* (2013.01); *H01L 23/24* (2013.01); *H01L 23/3192* (2013.01); *H01L 25/0652* (2013.01); *H01L 25/0655* (2013.01); *H01L 25/50* (2013.01); *H01L 23/291* (2013.01); *H01L 24/05* (2013.01); *H01L 24/08* (2013.01); *H01L 24/13* (2013.01); *H01L 24/29* (2013.01); *H01L 24/32* (2013.01); *H01L 24/83* (2013.01); *H01L 25/105* (2013.01); *H01L 25/18* (2013.01); *H01L 2224/0557* (2013.01); *H01L 2224/08145* (2013.01); *H01L 2224/13024* (2013.01);
(Continued)

(58) Field of Classification Search
CPC ............... H01L 23/3185; H01L 21/568; H01L 25/0655
See application file for complete search history.

(56) References Cited

U.S. PATENT DOCUMENTS 8,993,380 B2  3/2015  Hou et al.
9,281,254 B2  3/2016  Yu et al.
(Continued)

*Primary Examiner* — Dale E Page
*Assistant Examiner* — Wilner Jean Baptiste
(74) *Attorney, Agent, or Firm* — JCIPRNET

(57) ABSTRACT

A semiconductor structure and a manufacturing method thereof are provided. The semiconductor structure includes first semiconductor dies spaced apart from one another, second semiconductor dies stacked upon the first semiconductor dies with a one-to-one correspondence and electrically coupled to the first semiconductor dies, a first composite structure laterally interposed between two first semiconductor dies, a second composite structure laterally interposed between two second semiconductor dies, and a support substrate bonded to the second semiconductor dies and the second composite structure. The first composite structure includes a first material layer adjoining sidewalls of the two first semiconductor dies and a second material layer connected to and different from the first material layer. The second composite structure includes a third material layer adjoining sidewalls of the two second semiconductor dies and a fourth material layer connected to and different from the third material layer.

20 Claims, 32 Drawing Sheets

(51) Int. Cl.
    *H01L 23/24*         (2006.01)
    *H01L 25/00*         (2006.01)
    *H01L 25/065*       (2023.01)
    *H01L 23/00*         (2006.01)
    *H01L 23/29*         (2006.01)
    *H01L 25/10*         (2006.01)
    *H01L 25/18*         (2023.01)

(52) U.S. Cl.
    CPC ............... *H01L 2224/29188* (2013.01); *H01L 2224/32145* (2013.01); *H01L 2224/32225* (2013.01); *H01L 2224/32245* (2013.01); *H01L 2224/83005* (2013.01); *H01L 2225/1035* (2013.01); *H01L 2225/1058* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,679,947 B2 * | 6/2020 | Wang ...................... H01L 24/20 |
| 11,476,201 B2 * | 10/2022 | Chen ................... H01L 21/4853 |
| 2012/0256319 A1 * | 10/2012 | Mitsuhashi ....... H01L 27/14636 |
| | | 257/E23.145 |

* cited by examiner

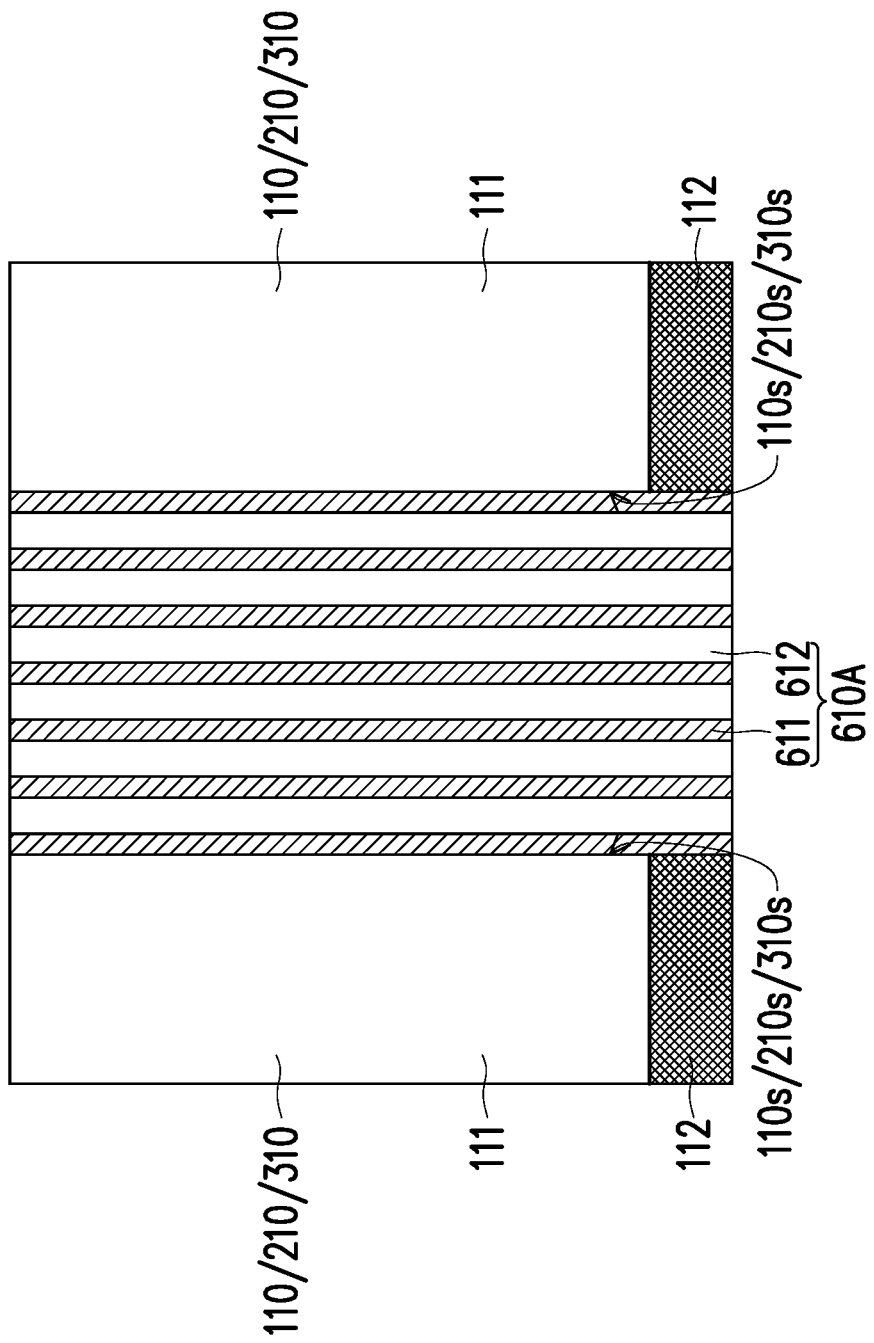

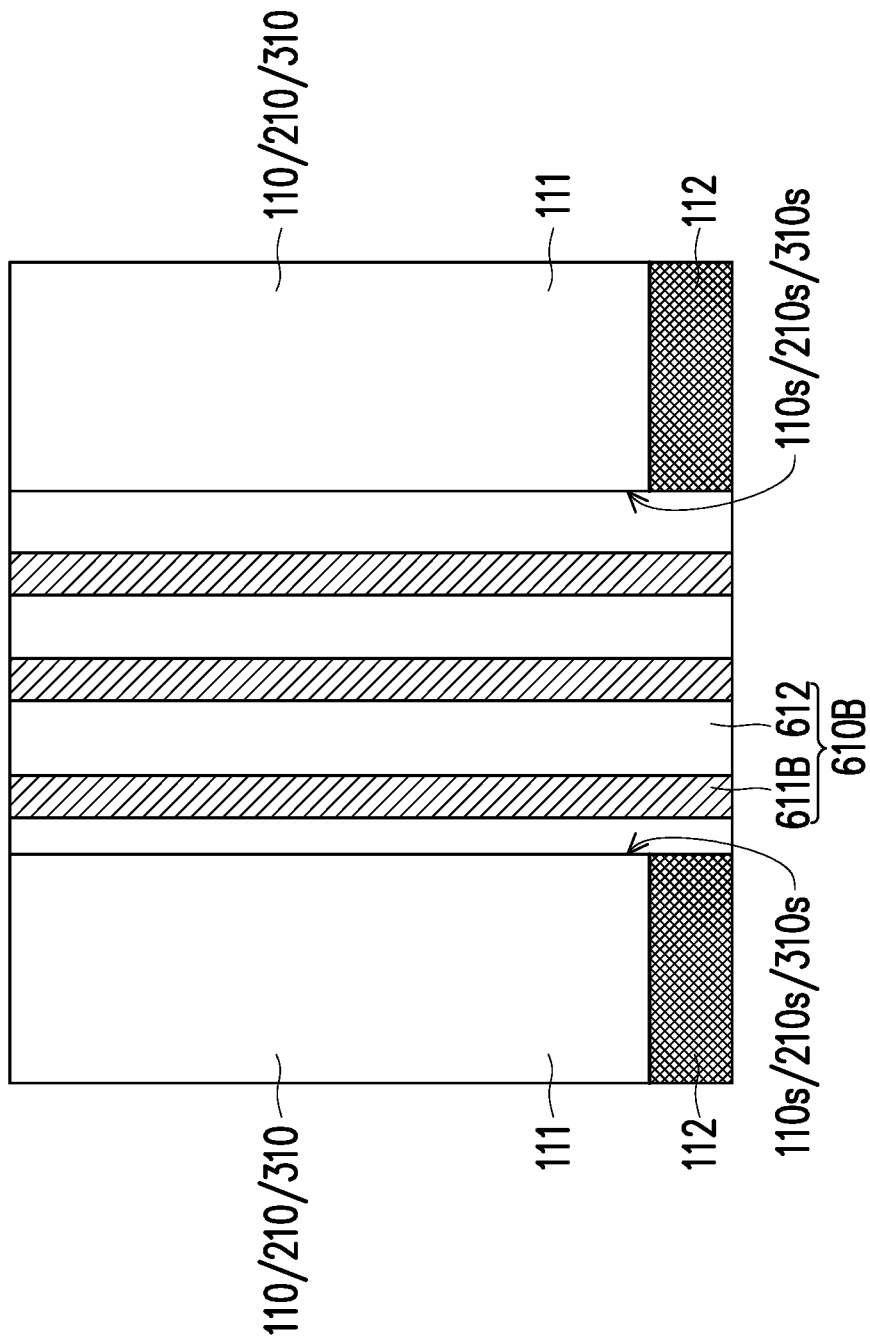

SEMICONDUCTOR STRUCTURE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). For the most part, these improvements in integration density have come from repeated reductions in minimum feature size, which allows more components to be integrated into a given area. Technological advances in integrated circuit (IC) design have produced generations of ICs where each generation has smaller and more complex circuit designs than the previous generation. Examples of the type of device packages for semiconductors include three-dimensional integrated circuits (3DICs). These relatively new types of packaging technologies for semiconductors face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7D are schematic and enlarged cross-sectional views of various structure in the dashed box A outlined in FIGS. 5A-5B in accordance with some embodiments.

DETAILED DESCRIPTION

Figure 1A:
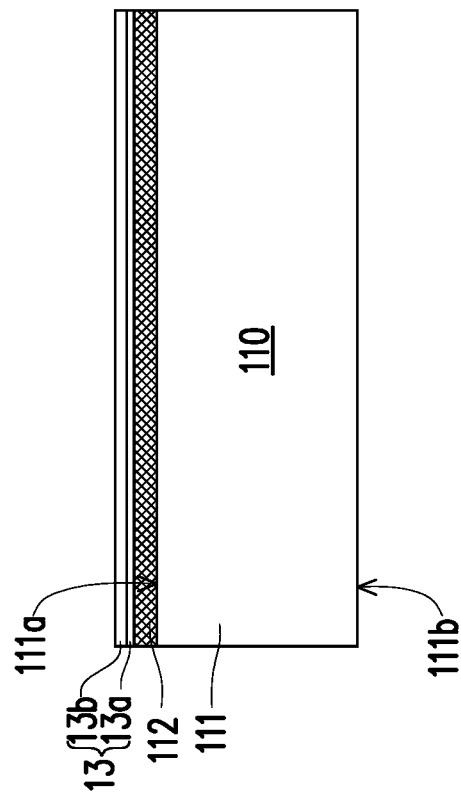
FIGS. 1A-1F are schematic cross-sectional views of various stages of manufacturing a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 180 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are schematic cross-sectional views of various stages of manufacturing a semiconductor structure in accordance with some embodiments. Referring to FIG. 1A, a plurality of semiconductor dies 110 is provided. For example, the semiconductor dies 110 are singulated from a semiconductor wafer (not shown), and the semiconductor wafer is processed to include multiple die regions. After formation, each die region of the semiconductor wafer may be probed and tested for functionality and performance, and only known good dies (KGDs) are selected and used for subsequently processing. The semiconductor dies 110 may be or may include logic dies, memory dies, radio frequency dies, power management dies, micro-electro-mechanical-system (MEMS) dies, sensor dies, the like, and/or combinations of these.

In some embodiments, each of the semiconductor dies 110 includes a semiconductor substrate 111 and a device layer 112, where the semiconductor substrate 111 has a front side 111a and a back side 111b opposite to each other, and the device layer 112 is formed on the front side 111a of the semiconductor substrate 111. The material(s) of the semiconductor substrate 111 may be (or include) elementary semiconductor (e.g., silicon or germanium in a crystalline, a polycrystalline, or an amorphous structure, etc.), a compound semiconductor (e.g., SiC, GaAs, GaP, InP, InAs, and/or InSb, etc.), an alloy semiconductor (e.g., SiGe, GaAsP, AlInAs, AlGaAs, GaInAs, GaInP, etc.), combinations thereof, or other suitable material(s). In some embodiments, the semiconductor substrate 111 includes multi-layer semiconductors, semiconductor-on-insulator (e.g., silicon-on-insulator or germanium-on-insulator), and/or the like. The device layer 112 may include semiconductor devices (e.g., transistors, diodes, resistors, capacitors, etc.; not individually illustrated) and a interconnect structure (not individually illustrated) formed over and electrically coupled to the semiconductor devices. The semiconductor devices may be formed using front-end of line (FEOL) fabrication techniques and arranged at the front side 111a of the semiconductor substrate 111, and the interconnect structure may be formed using back-end of line (BEOL) fabrication techniques and may include interconnect circuitries covered by dielectric layer(s).

In some embodiments, a sacrificial bonding layer 13 is formed over the device layer 112 of each of the semiconductor dies 110. The sacrificial bonding layer 13 may include a single dielectric material or may include multiple dielectric sublayers. For example, a lower dielectric sublayer 13a is formed over the front side 111a of the semiconductor substrate 111 to cover the device layer 112, and an upper dielectric sublayer 13b is formed on the lower dielectric sublayer 13a. The lower dielectric sublayer 13a may act as a planarization layer for facilitating the subsequent bonding process, and the upper dielectric sublayer 13b may act as a bonding film. The materials of the dielectric sublayers 13a and 13b may be or may include silicon oxide, silicon oxynitride, silicon nitride, borosilicate glass (BSG), phosphoric silicate glass (PSG), borophosphosilicate glass (BPSG), fluorinated silicate glass (FSG), a combination thereof, and/or any suitable dielectric material. It is noted that the sacrificial bonding layer 13 including two sublayers is shown for illustrative purposes only, and the number of the sublayers construes no limitation in the disclosure.

Figure 1B:
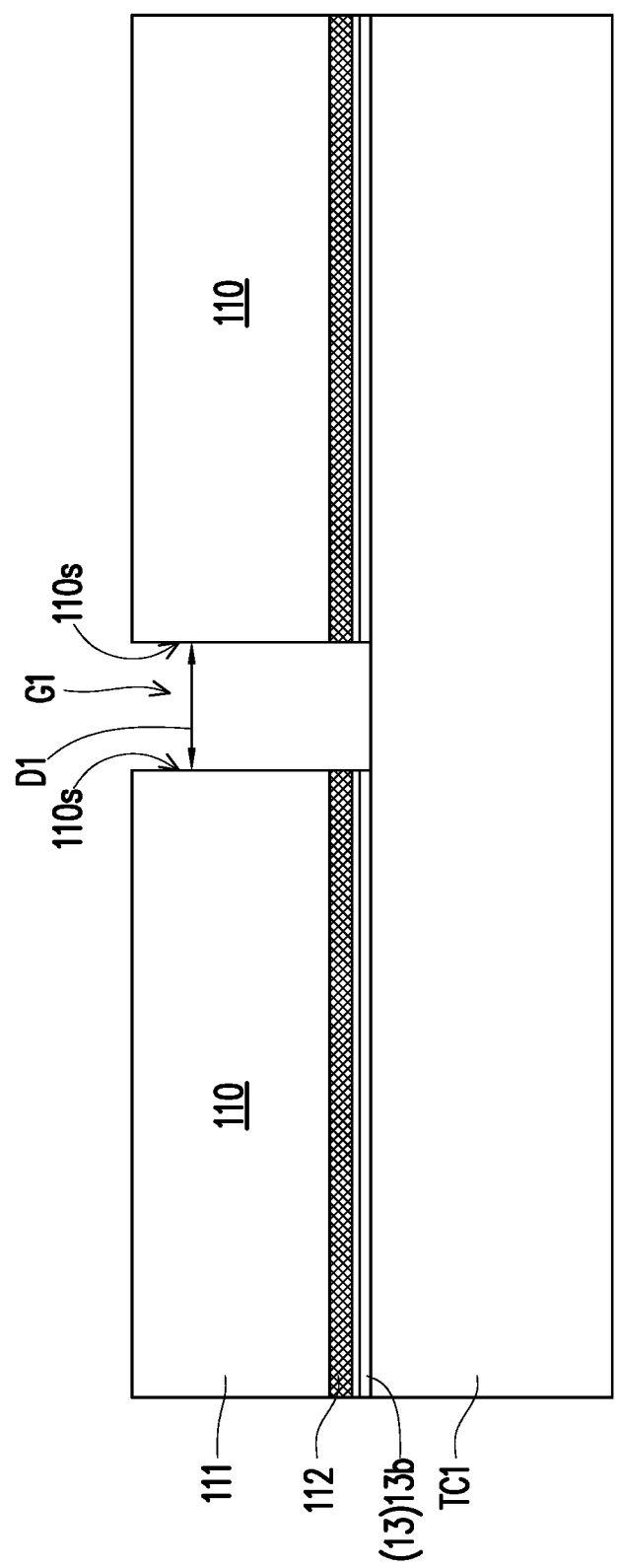

Referring to FIG. 1B, the semiconductor dies 110 may be disposed on a temporary carrier TC1, where the sacrificial bonding layer 13 may be attached to the temporary carrier TC1. For example, the semiconductor dies 110 are arranged in an array on the temporary carrier TC1 and may be spatially spaced apart from one another so that a gap G1 is formed between adjacent semiconductor dies 110. The gap G1 has a lateral distance D1 measured from a sidewall 110s of one of the semiconductor die 110 to the closest sidewall 110s of the adjacent semiconductor die 110, where the lateral distance D1 is non-zero. A material of the temporary carrier TC1 may include glass, metal, ceramic, silicon, plastic, combinations thereof, multi-layers thereof, or other suitable material that can provide structural support during processing. In some embodiments, the temporary carrier TC1 is provided with a temporary bonding layer (not individually illustrated). In some embodiments, the temporary bonding layer includes a silicon-containing dielectric material (e.g., silicon oxide, silicon nitride, etc.) or other suitable dielectric material(s) used for bonding. For example, the upper dielectric sublayer 13b of each of the semiconductor dies 110 is bonded to the temporary bonding layer, and the bonding involves oxide-to-oxide bonding. In some embodiments, the temporary bonding layer may be a die attach film (DAF), a light-to-heat conversion (LTHC) release coating, glue, an adhesive, or the like. Alternatively, the temporary bonding layer is omitted.

Figure 1C:
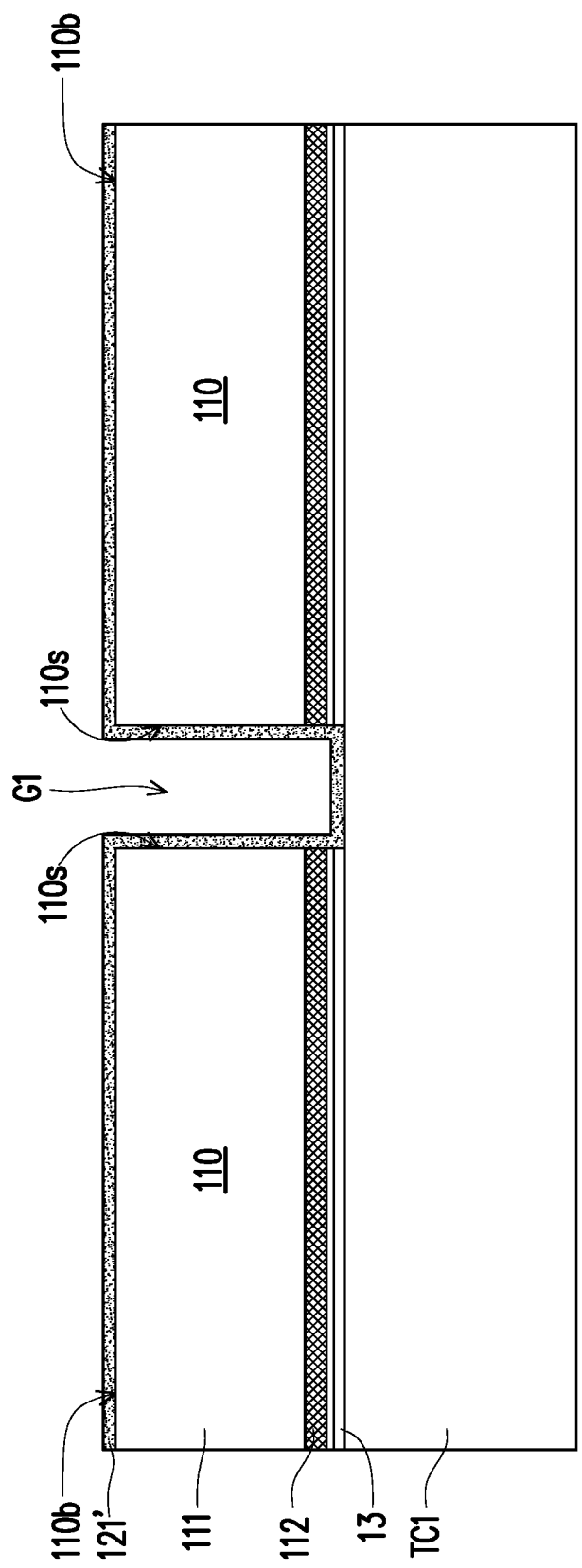

Referring to FIG. 1C, a protective liner material 121' may be formed on the semiconductor dies 110 and also formed in the gap G1. For example, the protective liner material 121' is in direct contact with the back surfaces 110b and the sidewalls 110s of the semiconductor dies 110, and the protective liner material 121' may extend to cover an exposed portion of the temporary carrier TC1 within the gap G1 between the sidewalls 110s of the semiconductor dies 110. Alternatively, the protective liner material 121' is only formed in the gap G1 to cover the sidewalls 110s of the semiconductor dies 110, and the protective liner material 121' does not extend to cover the back surfaces 110b of the semiconductor dies 110. For example, a planarization process (e.g. chemical mechanical polishing (CMP), grinding, etching, a combination thereof, and/or the like) is performed to partially remove portions of the protective liner material 121' overlying the back surfaces 110b of the semiconductor dies 110.

The protective liner material 121' may be formed of or include silicon nitride, silicon carbide, silicon oxycarbide, or the like, or combinations thereof. For example, the dielectric layer material 121' is deposited as a conformal layer so that the horizontal portions and vertical portions of protective liner material 121' have thicknesses close to each other, within process variations. In some embodiments, the formation of the protective liner material 121' is performed by such as atomic layer deposition (ALD), plasma enhanced ALD, or the like, and thus the protective liner material 121' may be referred to as an ALD film. Such technique may allow the film growth to precede layer-by-layer and allow for thickness control over complex structures. The reaction conditions may be adjusted to deposit a film with a desired density. The protective liner material 121' with the desired density may prevent the underlying semiconductor substrate 111 from damaging in the subsequent processes. It should be understood that the value described herein is merely an example since the density of the ALD film increased as a function of deposition temperature. Other suitable deposition process (e.g., chemical vapor deposition (CVD), plasma enhance CVD (PECVD), physical vapor deposition (PVD), or the like) may be employed, in accordance with some embodiments.

Figure 1D:
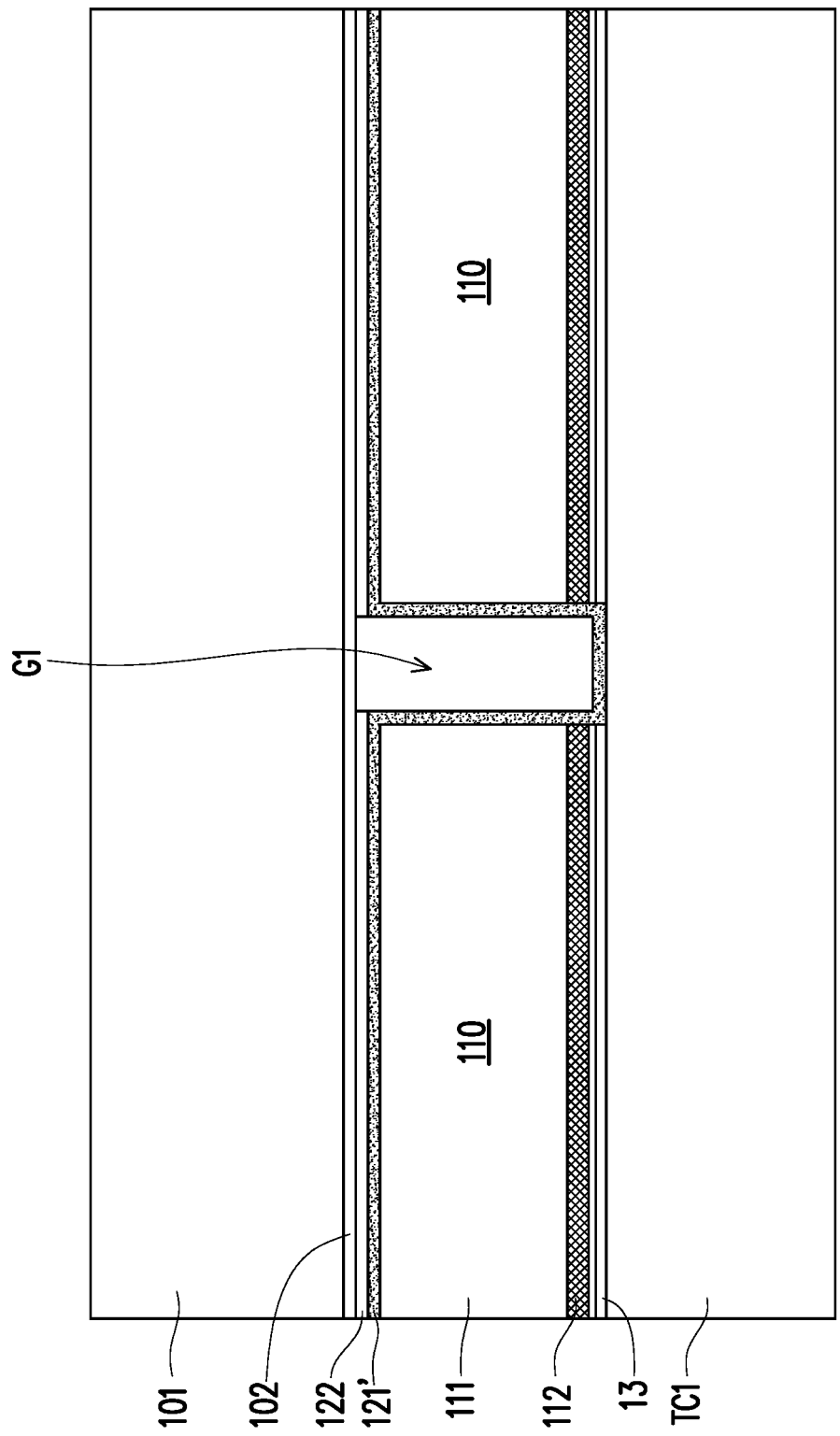

Referring to FIG. 1D, a bonding dielectric layer 122 may be formed on the protective liner material 121' and over the back surfaces 110b of the semiconductor dies 110. The material of the bonding dielectric layer 122 may be or may include silicon oxide, silicon oxynitride, silicon nitride, BSG, PSG, BPSG, FSG, a combination thereof, and/or any suitable dielectric material. In some embodiments, the material density of the protective liner material 121' is greater than the material density of the bonding dielectric layer 122 at a same temperature condition. In some embodiments where the protective liner material is not formed on the back surfaces 110b of the semiconductor dies 110, the bonding dielectric layer 122 may be in direct contact with the back surfaces 110b of the semiconductor dies 110.

Once the bonding dielectric layer 122 is formed over the semiconductor dies 110, a support substrate 101 may be attached to the semiconductor dies 110 through the bonding dielectric layers 122 and 102. The support substrate 101 may thus cover the gap G1. A material of the support substrate 101 may include glass, metal, ceramic, silicon, plastic, combinations thereof, multi-layers thereof, or other suitable material that can provide structural support. In some embodiments, the support substrate 101 is a silicon block made from a wafer, applied as a support substrate and a heat-conduction path for the semiconductor dies 110. In some embodiments, the temporary carrier TC1 and the support substrate 101 are provided in a wafer form, and a wafer-to-wafer bonding is performed to attach the support substrate 101 to the underlying structure. In some embodiments, the support substrate 101 is provided with the bonding dielectric layer 102. In some embodiments, the bonding dielectric layer 102 includes a silicon-containing dielectric material (e.g., silicon oxide, silicon nitride, etc.) or other suitable dielectric material(s) used for bonding. For example, the bonding dielectric layer 122 is bonded to the bonding dielectric layer 102 and the bonding involves oxide-to-oxide bonding. Alternatively, the bonding dielectric layer 102 may be replaced with a DAF, glue, an adhesive, or the like.

Figure 1E:
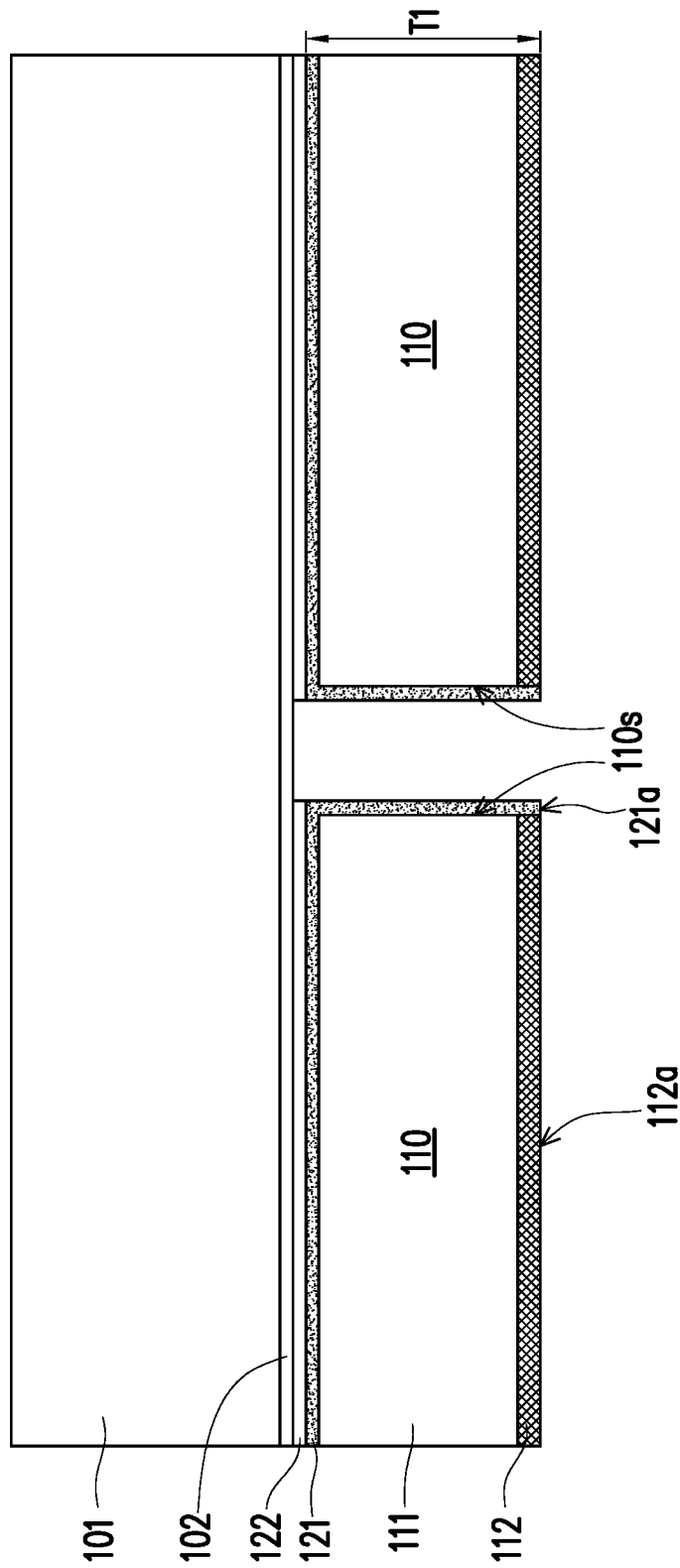

Referring to FIG. 1E and with reference to FIG. 1D, once the support substrate 101 is attached to the semiconductor dies 110, the temporary carrier TC1 may be de-bonded to expose the semiconductor dies 110. For example, the de-bonding process includes grinding, etching, peeling, a combination thereof, and/or the like. During the removal of the temporary carrier TC1, the sacrificial bonding layer 13 may be removed together with the temporary carrier TC1, and a portion of the protective liner material 121' formed on the temporary carrier TC1 may also be removed to form a protective liner 121. After releasing the temporary carrier TC1, the device layer 112 of each of the semiconductor dies 110 may be accessibly revealed. For example, after the de-bonding process, the outer surface 112a of the device layer 112 is substantially leveled (e.g., coplanar) with the outer surface 121a of the protective liner 121. In some embodiments, the overall thickness T1 including the thicknesses of the respective semiconductor die 110 and the overlying protective liner 121 is about 100 μm or greater than 100 μm. Although other value of the overall thickness T1 may be possible depending on product and process requirements.

Figure 1F:
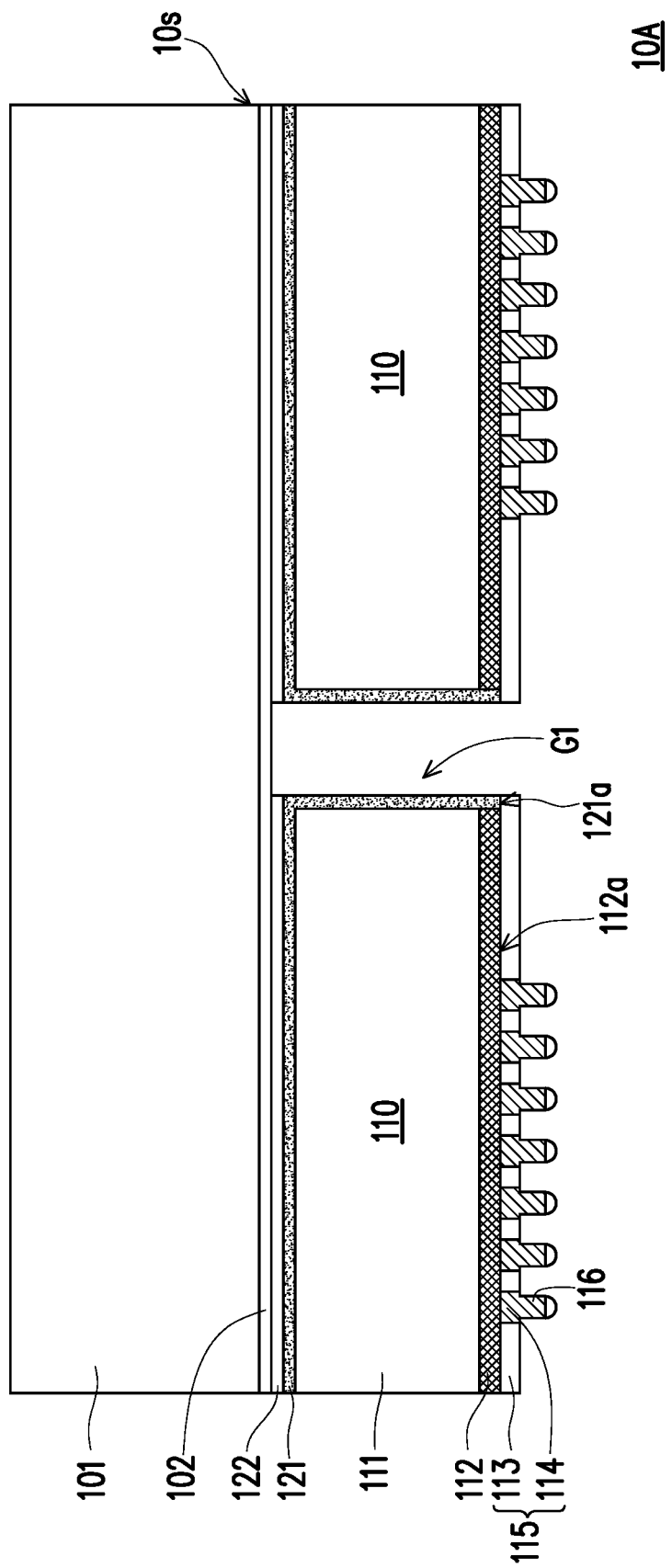

Referring to FIG. 1F, a redistribution structure 115 including a patterned dielectric layer 113 and a patterned conductive layer 114 may be formed underneath the device layers 112 of the semiconductor dies 110. In some embodiments, the patterned dielectric layer 113 is first formed underneath the outer surface 112a of the device layer 112 and the outer surface 121a of the protective liner 121a, and then the patterned conductive layer 114 is formed in the patterned dielectric layer 113. The patterned dielectric layer 113 may include any suitable dielectric material(s) and may have a material density less than the material density of the protective liner 121 at a same temperature condition. The patterned conductive layer 114 including conductive pads, conductive lines, conductive vias, and/or the like, may be electrically coupled to the interconnect circuitries and the semiconductor devices (not individually shown) in the device layer 112. Subsequently, a plurality of conductive bumps 116 may be formed to be coupled to the patterned conductive layer 114 for further electrical connection. The conductive bumps 116 may be or may include micro-bumps, metal pillars, electroless nickel-electroless palladium-immersion gold (ENEPIG) bumps, controlled collapse chip connection (C4) bumps, or the like. In some embodiments, each of the conductive bumps 116 includes a metal cap (e.g., solder cap) formed on the top of a metal pillar. In some embodiments, the conductive bumps 116 are metal pillars and solder-free.

In some embodiments, a singulation process is performed to form a plurality of semiconductor structures 10A. For example, the respective semiconductor structure 10A includes a coterminous sidewall 10s, where the coterminous sidewall 10s includes the sidewalls of the support substrate 101, the bonding dielectric layer 102, the bonding dielectric layer 122, the horizontal portion of the protective liner 121, the semiconductor substrate 111, the device layer 112, and the patterned dielectric layer 113 of the redistribution structure 115. The semiconductor structure 10A may have the gap G1 formed between the adjacent semiconductor dies 110, where the gap G1 is air gap and is free of gap-filling layer formed therein. It is the natural tendency of the substrate to warp during thermal cycling, testing or operation, and the warpage and stress in the semiconductor structure may lead to the increase of the risk of delamination and cracking of the semiconductor dies. By lining each of the semiconductor dies 110 with the protective liner 121 having a greater density, the risk of delamination and cracking of the semiconductor dies may be reduced or eliminated. In some embodiments, the semiconductor structure 10A may be viewed as an integrated die and may be packaged and processed to form a semiconductor package as will be described later in other embodiments.

Figure 2A:
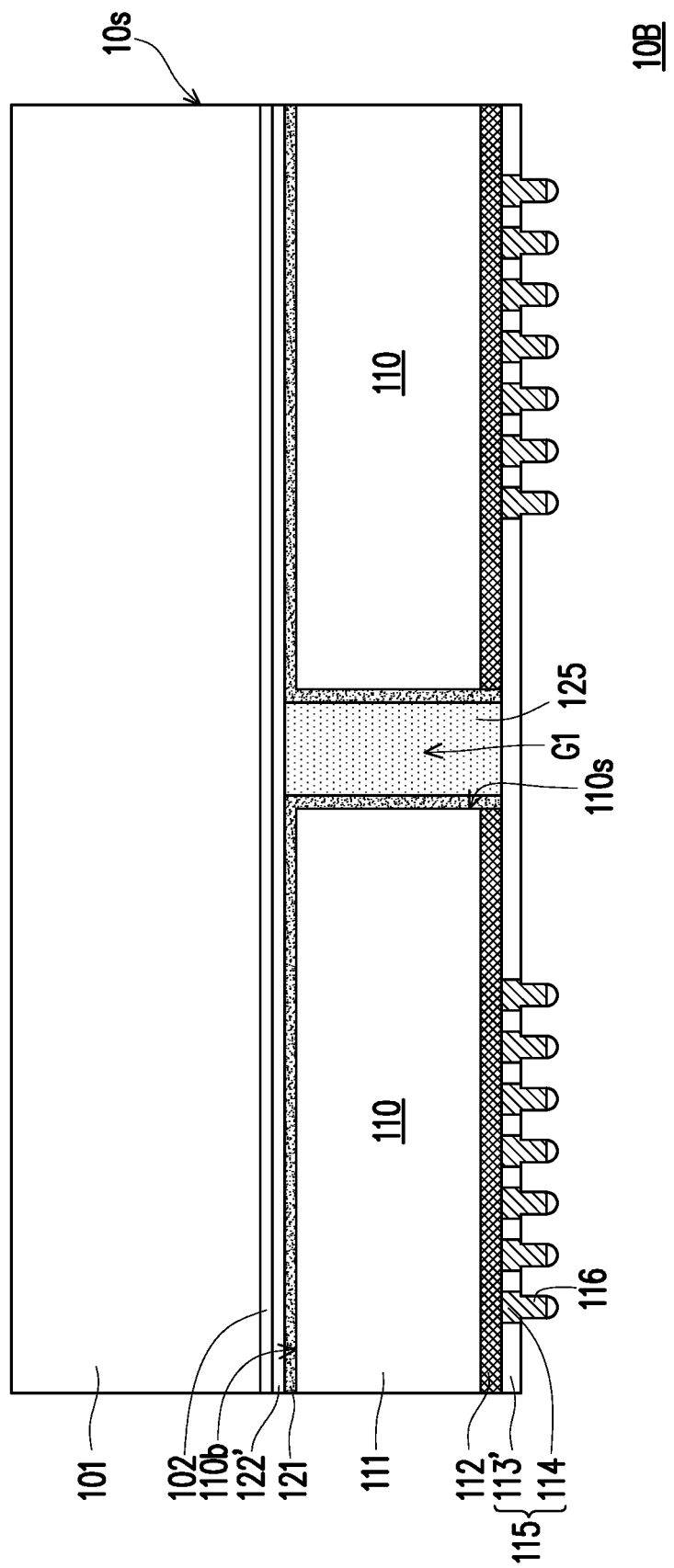
FIGS. 2A and 2B are schematic cross-sectional views of variations of a semiconductor structure in accordance with some embodiments.
Figure 2B:
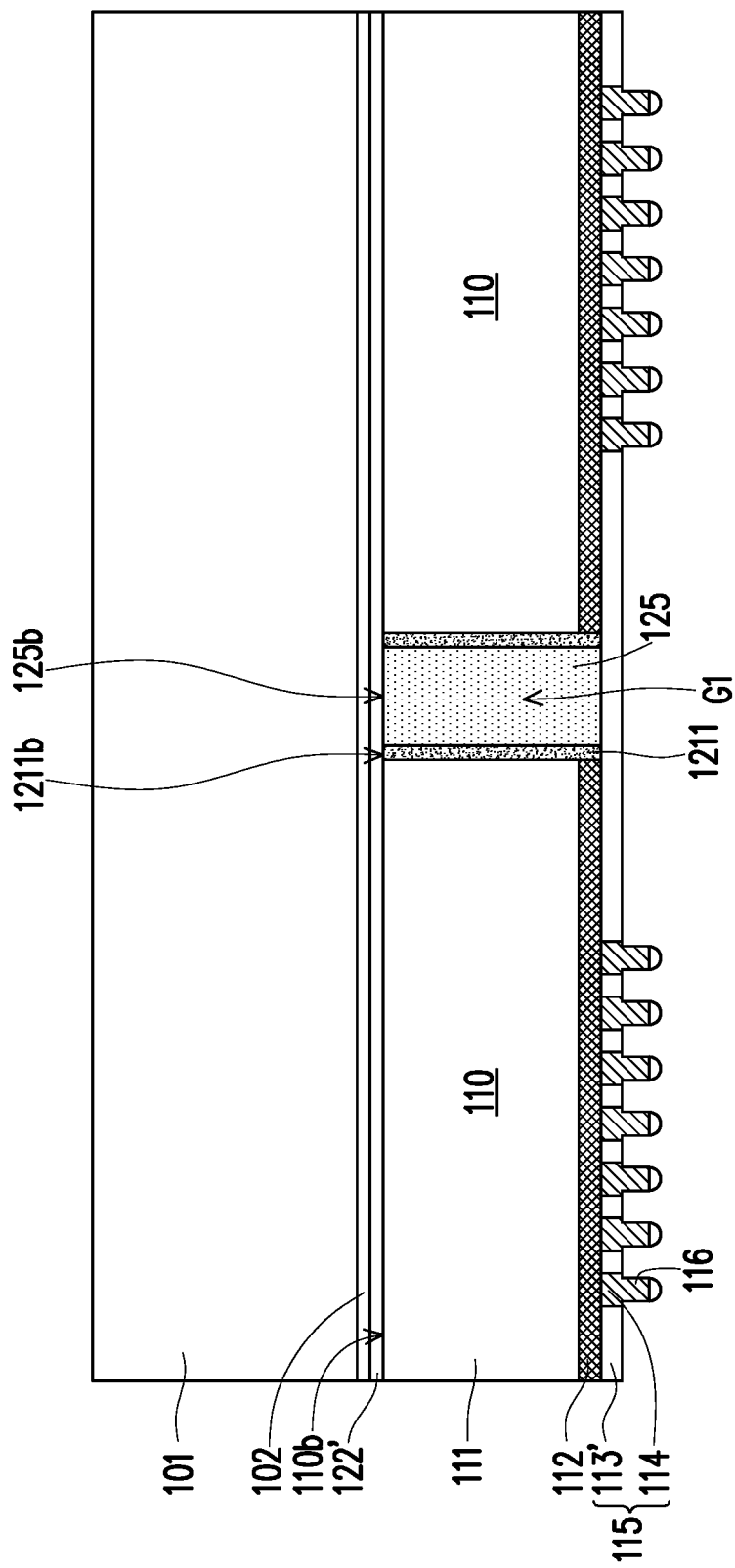

FIGS. 2A and 2B are schematic cross-sectional views of variations of a semiconductor structure in accordance with some embodiments. The formations of semiconductor structures in FIGS. 2A-2B are similar to that of the semiconductor structure 10A shown in FIGS. 1A-1F, and thus the detailed descriptions are not repeated for the sake of brevity. Throughout the various views and illustrative embodiments, the identical or similar numbers refer to the identical or similar elements.

Referring to FIG. 2A and with reference to FIG. 1F, the difference between the semiconductor structures 10B and 10A includes that a gap-filling layer 125 is formed in the gap G1 between the adjacent semiconductors dies 110 and the bonding dielectric layer 122' and the patterned dielectric layer 113' respectively extend to cover two opposing sides of the gap-filling layer 125. For example, the gap-filling layer 125 is formed after forming the protective liner material 121' as shown in FIG. 1C and before attaching the support substrate 101 to the semiconductor dies 110 as shown in FIG. 1D. When forming the bonding dielectric layer as shown in FIG. 1D, the bonding dielectric layer 122' extends across the semiconductor dies 110 and the gap-filling layer 125. After removing the temporary carrier TC1 as shown in FIG. 1E, a portion of the protective liner material 121' overlying the temporary carrier TC1 may be removed to accessibly reveal the gap-filling layer 125. When forming the redistribution structure 115, the patterned dielectric layer 113' is formed underneath the device layers 112 of the semiconductor dies 110 and also formed underneath the gap-filling layer 125.

The gap-filling layer 125 may include polymeric material with low outgassing rate. The gap-filling layer 125 may have a material having high thermal tolerance with high glass transition temperature (Tg) (e.g., at least 280° C. or above) to withstand the high process/operation temperatures. The material properties of the gap-filling layer 125 may also exhibit improved damage tolerance and crack propagation resistance. In some embodiments, the protective liner 121 has a greater material density than the material density of the gap-filling layer 125 at a same temperature condition. By lining the semiconductor dies 110 with the protective liner 121 and filling the gap G1 with the gap-filling layer 125, the risk of delamination and cracking of the semiconductor dies 110 may be reduced or eliminated.

Referring to FIG. 2B with reference to FIG. 2A, a semiconductor structure 10C is similar to the semiconductor structure 10B, and the difference between the semiconductor structures 10C and 10B includes that the protective liner 1211 is not formed on the back surfaces 110b of the semiconductor dies 110. As compared with the semiconductor structure 10B, the horizontal portions of the protective liner overlying the back surfaces 110b of the semiconductor dies 110 are omitted, and only vertical portions of the protective liner remain. For example, after forming the protective liner material 121' as shown in FIG. 1C or after forming the gap-filling layer 125 in the gap G1, a planarization process (e.g., CMP, grinding, etching, a combination thereof, and/or the like) is performed on the protective liner material 121' to remove the horizontal portions of protective liner material 121' overlying the back surfaces 110b of the semiconductor dies 110. In some embodiments, the back surfaces 110b of the semiconductor dies 110 are substantially leveled with the upper surfaces 125b of the gap-filling layer 125 and the upper surfaces 1211b of the protective liner 1211. Alternatively, the gap-filling layer 125 is omitted. Subsequently, the bonding dielectric layer 122' may be directly formed on the back surfaces 110b of the semiconductor dies 110 and may also be formed on the upper surfaces 125b of the gap-filling layer 125 and the upper surfaces 1211b of the protective liner 1211. The rest of the processes may be similar to the processes described in FIGS. 1D-1F and 2A.

FIGS. 3A-3H are schematic cross-sectional views of various stages of manufacturing a semiconductor structure in accordance with some embodiments. The forming process described in FIGS. 3A-3H is similar to the forming processes described in FIGS. 1A-1E, except that the forming processes illustrated in FIGS. 3A-3H involves stacking semiconductor dies upon one another to form die stacks. It should be appreciated that throughout the various views and illustrative embodiments, the identical or similar numbers refer to the identical or similar elements, and the detailed descriptions are not repeated for the sake of brevity.

Figure 3A:
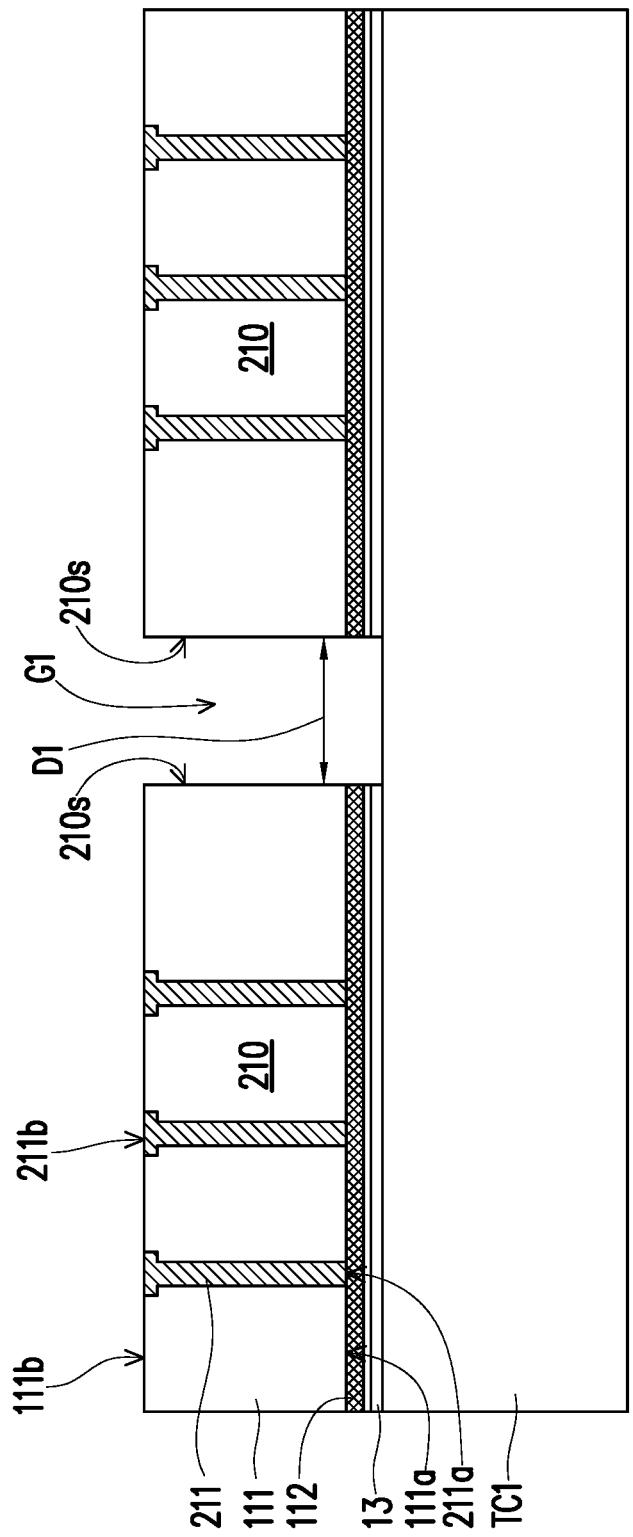
FIGS. 3A-3H are schematic cross-sectional views of various stages of manufacturing a semiconductor structure in accordance with some embodiments.

Referring to FIG. 3A, a plurality of first semiconductor dies 210 may be provided and disposed on the temporary carrier TC1. The first semiconductor dies 210 may be arranged in an array on the temporary carrier TC1 and may be spatially spaced apart from one another to form the gap G1 between two adjacent first semiconductor dies 210. The gap G1 has the lateral distance D1 measured between the adjacent sidewalls 210s of the adjacent first semiconductor dies 210, where the lateral distance D1 is non-zero. The first semiconductor dies 210 may be disposed on the temporary carrier TC1 in a manner as described in FIG. 1B, where the sacrificial bonding layer 13 underlying the front side 111a of the semiconductor substrate 111 may be attached to the temporary carrier TC1.

The respective first semiconductor die 210 may be similar to the semiconductor die 110 described in FIG. 1A, except that the first semiconductor die 210 includes through substrate vias (TSVs) 211 penetrating through the semiconductor substrate 111. In some embodiments, the respective TSV 211 has a lower end 211a and an upper end 211b opposite to each other, where the lower end 211a is electrically connected to the semiconductor devices and/or the interconnect circuitries in the device layer 112, and the upper end 211b may be accessibly revealed at the back side 111b of the semiconductor substrate 111. In some embodiments, the respective TSV 211 has a T-shaped cross-section, where the upper end 211b is wider than the lower end 211a. Alternatively, the respective TSV 211 may have a rectangular cross-section or may have other shape, depending on process requirements.

Figure 3B:
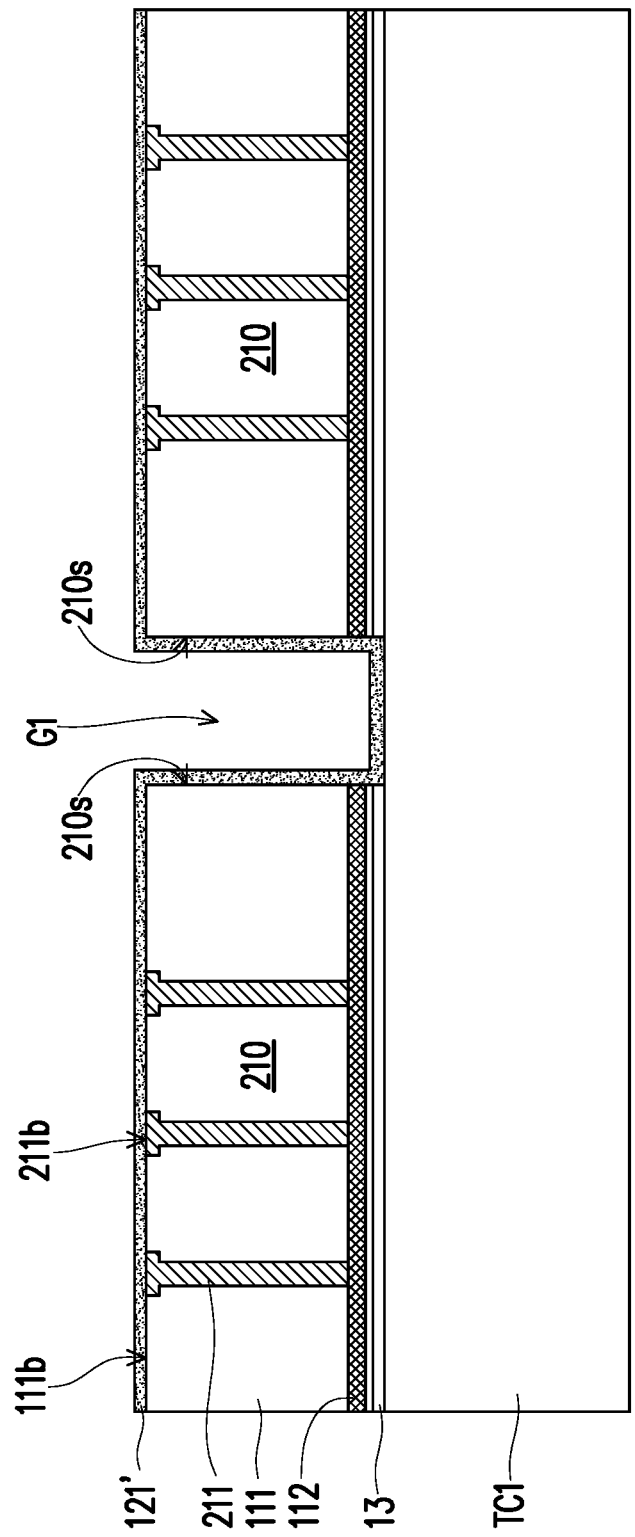

Referring to FIG. 3B, the first protective liner material 121' may be formed on the first semiconductor dies 210 and also formed in the gap G1. The forming process and the material of the first protective liner material 121' may be similar to those of the protective liner material 121' described in FIG. 1C. For example, the first protective liner material 121' is formed on the back side 111b of the semiconductor substrate 111 and the upper ends 211b of the TSVs 211 of each of the first semiconductor dies 210. The first protective liner material 121' may be conformally formed in the gap G1 and cover the sidewall 210s of each of the first semiconductor dies 210. The first protective liner material 121' may also be formed on the exposed portion of the temporary carrier TC1 in the gap G1.

Figure 3C:
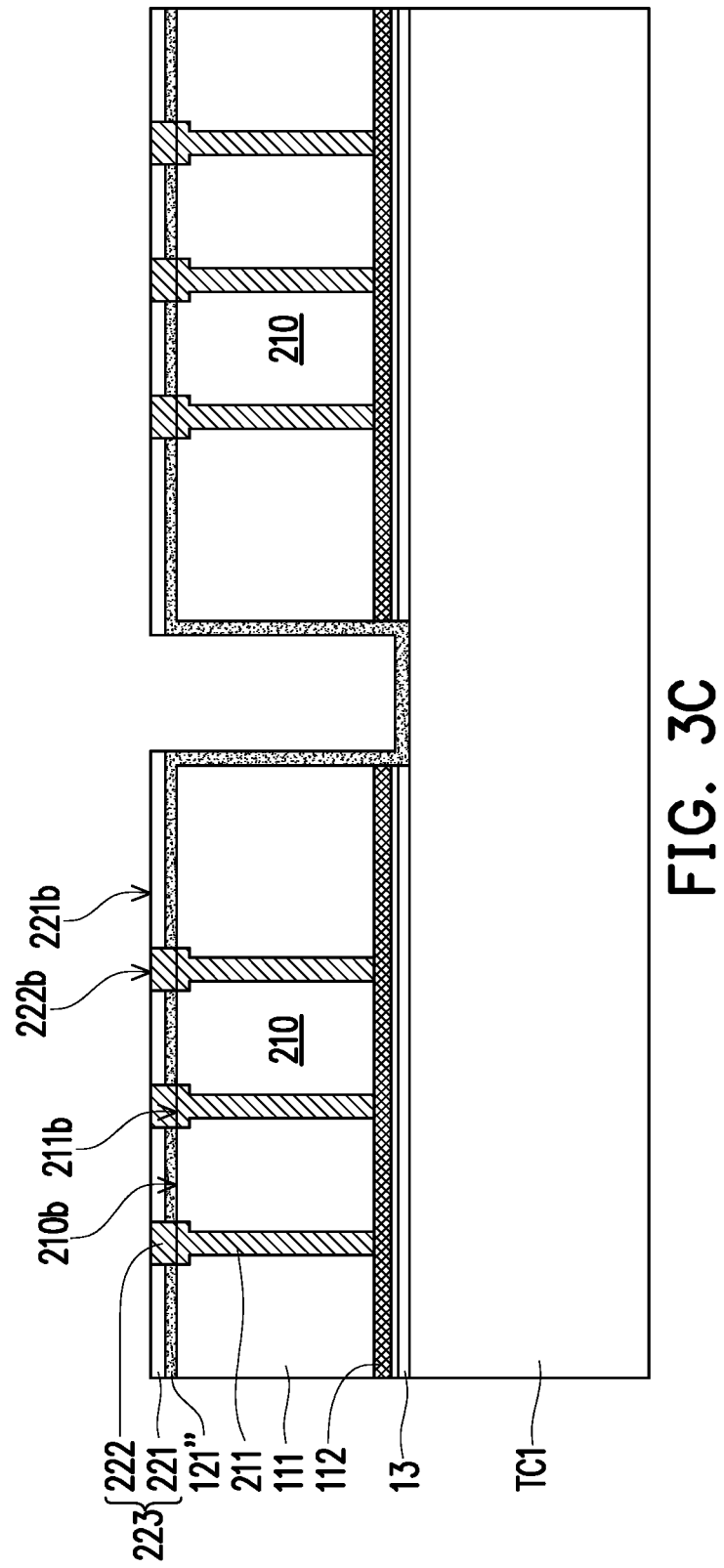

Referring to FIG. 3C, a first bonding structure 223 including a first bonding dielectric layer 221 and first bonding pads 222 may be formed over the respective first semiconductor die 210. A material of the first bonding dielectric layer 221 may be similar to the material of the bonding dielectric layer 122 described in FIG. 1D. For example, the bonding dielectric material layer is first formed on the first protective liner material 121' over the back sides 210b of the first semiconductor dies 210. Next, portions of the bonding dielectric material layer and the underlying portions of the first protective liner material 121' may be removed to respectively form the first bonding dielectric layer 221 and the first patterned protective liner 121" which have openings accessibly revealing the surfaces of the upper ends 211b of the TSVs 211. Subsequently, conductive material(s) may be formed in the openings to form the first bonding pads 222 that are in direct contact with the TSVs 211. In some embodiments, the first bonding pads 222 are laterally covered by the first patterned protective liner 121" and the first bonding dielectric layer 221 and may be electrically coupled to the interconnect circuitries and the semiconductor devices in the device layer 112 through the TSVs 211. A planarization process (e.g., CMP, grinding, etching, a combination thereof, and/or the like) may be performed so that the top surfaces 222b of the first bonding pads 222 may be substantially leveled (e.g., coplanar) with the top surface 221b of the first bonding dielectric layer 221, within process variations.

Figure 3D:
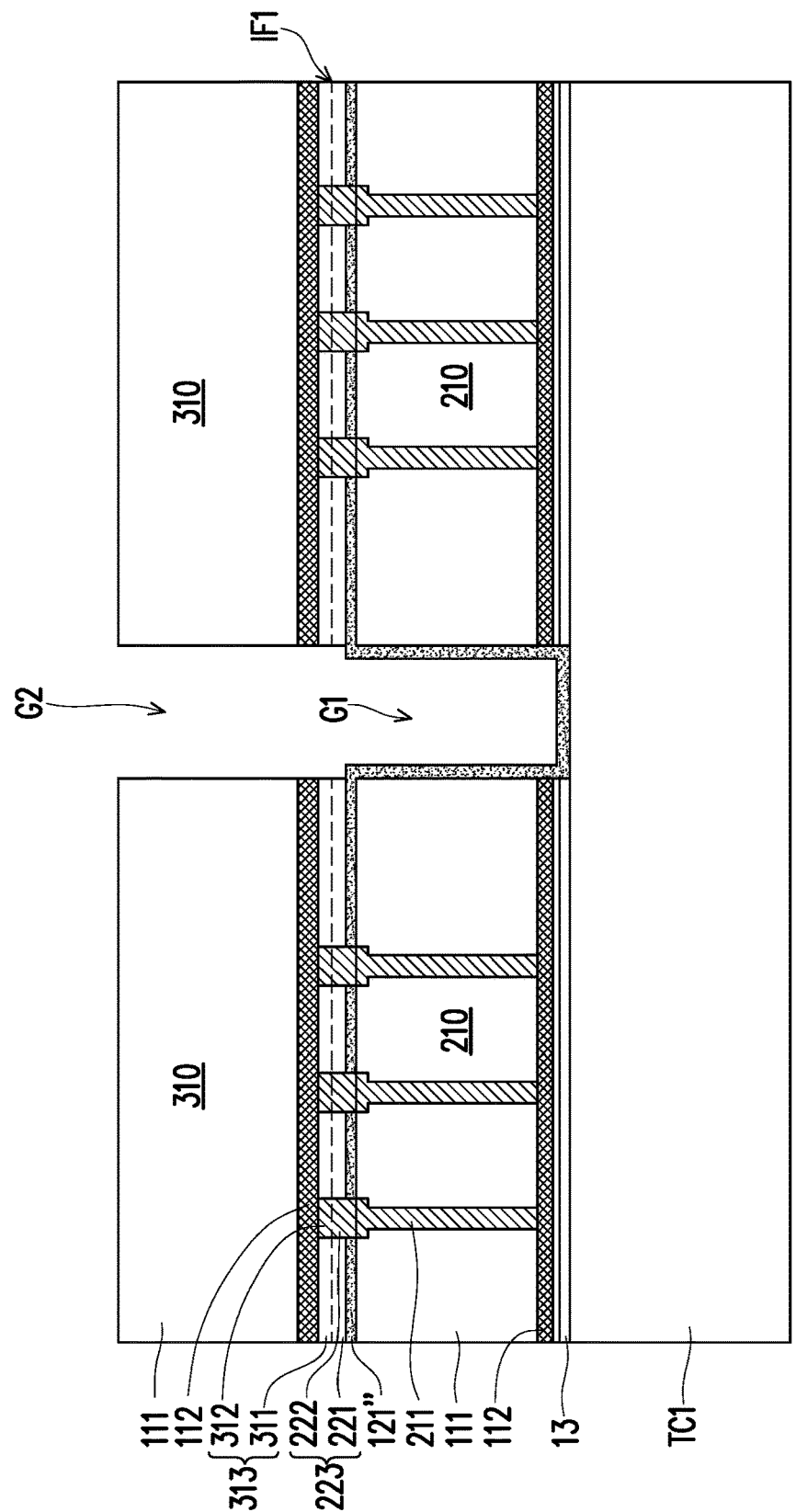

Referring to FIG. 3D, a plurality of second semiconductor dies 310 may be bonded to the first semiconductor dies 210 with a one-to-one correspondence to form die stacks 200 over the temporary carrier TC1. The gap G2 corresponding to the gap G1 may be formed between two adjacent second semiconductor dies 310. In some embodiments, additional semiconductor dies 210 having the TSVs 211 are stacked upon and bonded to the first semiconductor dies 210 before stacking the second semiconductor dies 310 to form a die stack having more than two tiers.

The respective second semiconductor die 310 is similar to the semiconductor die 110 described in FIG. 1A, except that the second semiconductor die 310 includes a second bonding structure 313 coupled to the device layer 112. For example, the second bonding structure 313 includes a second bonding dielectric layer 311 and second bonding pads 312 laterally covered by the second bonding dielectric layer 311, where the second bonding pads 312 may be electrically coupled to the interconnect circuitries and the semiconductor devices in the device layer 112. After the bonding process, the second bonding structure 313 of the respective second semiconductor die 310 may be bonded to the first bonding structure 223 of the corresponding first semiconductor die 210, where the second bonding dielectric layer 311 may be bonded to the first bonding dielectric layer 221, and the second bonding pads 312 may be bonded to the first bonding pads 222 with a one-to-one correspondence. In some embodiments, the interface IF1 between the bonded first and second semiconductor dies 210 and 310 is substantially flat. For example, dielectric-to-dielectric bonds and metal-to-metal bonds are formed at the interface IF1 of the respective die stack 200. In some embodiments, dielectric-to-metal bonds may be formed at the interface IF1 as the second bonding pads 312 are misaligned with the first bonding pads 222.

Figure 3E:
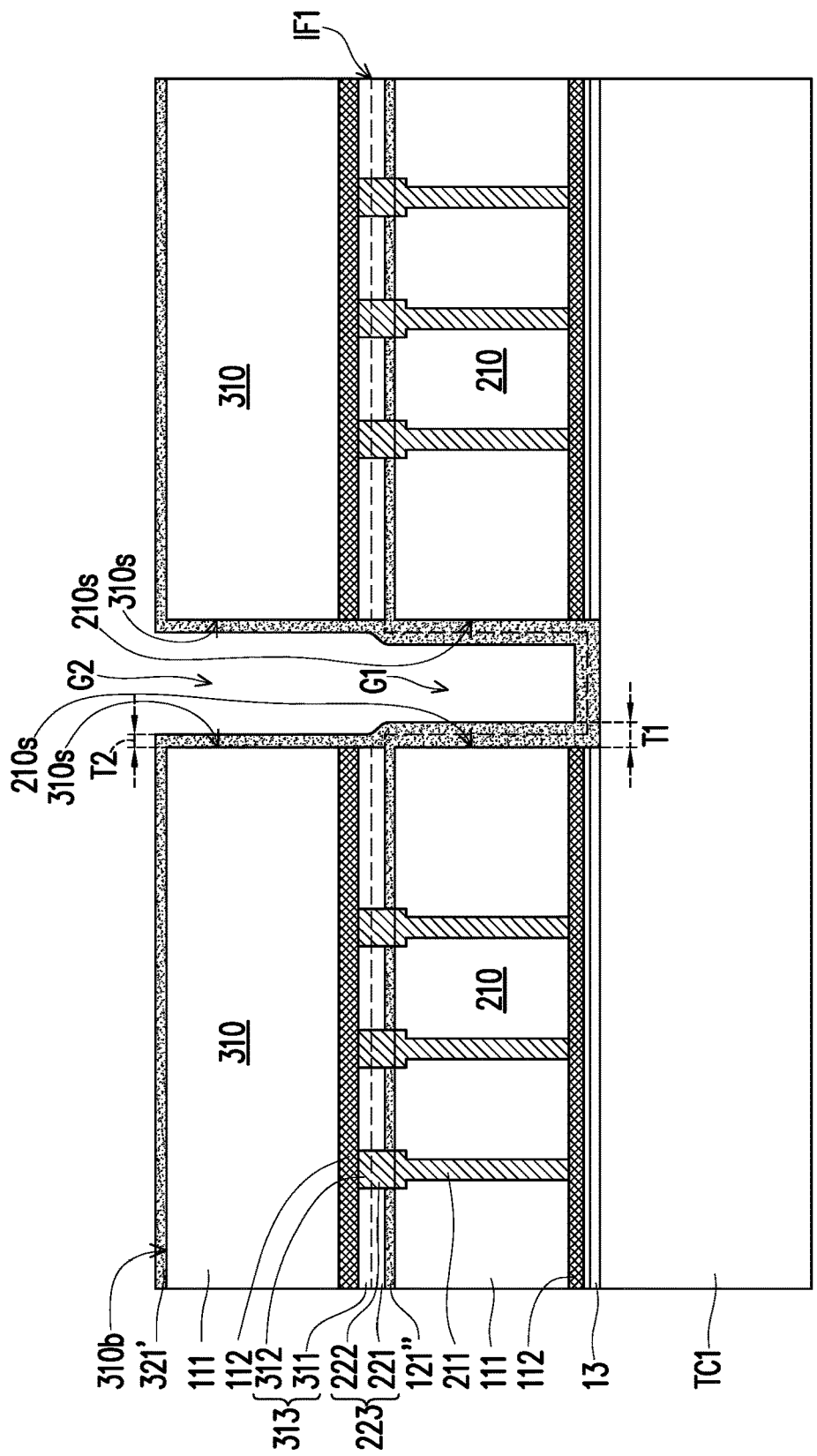

Referring to FIG. 3E, a second protective liner material 321' may be formed on the die stack 200 and also formed in the gaps G1 and G2. The forming process and the material of the second protective liner material 321' may be similar to the protective liner material 121' described in FIG. 1C. For example, the second protective liner material 321' is formed on the back sides 310b of the second semiconductor dies 310 and extends to cover the sidewalls 310s of the second semiconductor dies 310. The second protective liner material 321' may further extend to cover the horizontal portions and vertical portions of the first patterned protective liner 121" in the gap G1. In some embodiments, the materials of the second protective liner material 321' and the first patterned protective liner 121" are the same, and no visible interface may be formed therebetween. Therefore, the dashed lines indicates that the interface between the first patterned protective liner 121" and the second protective liner material 321' may (or may not) exist. In some embodiments, the portion of the second protective liner material 321' covering the respective second semiconductor die 310 has a thickness T2, the overall protective liner including the first patterned protective liner 121" and the overlying second protective liner material 321' formed in the gap G1 has a thickness T1, and the thickness T2 is less than the thickness T1.

Figure 3F:
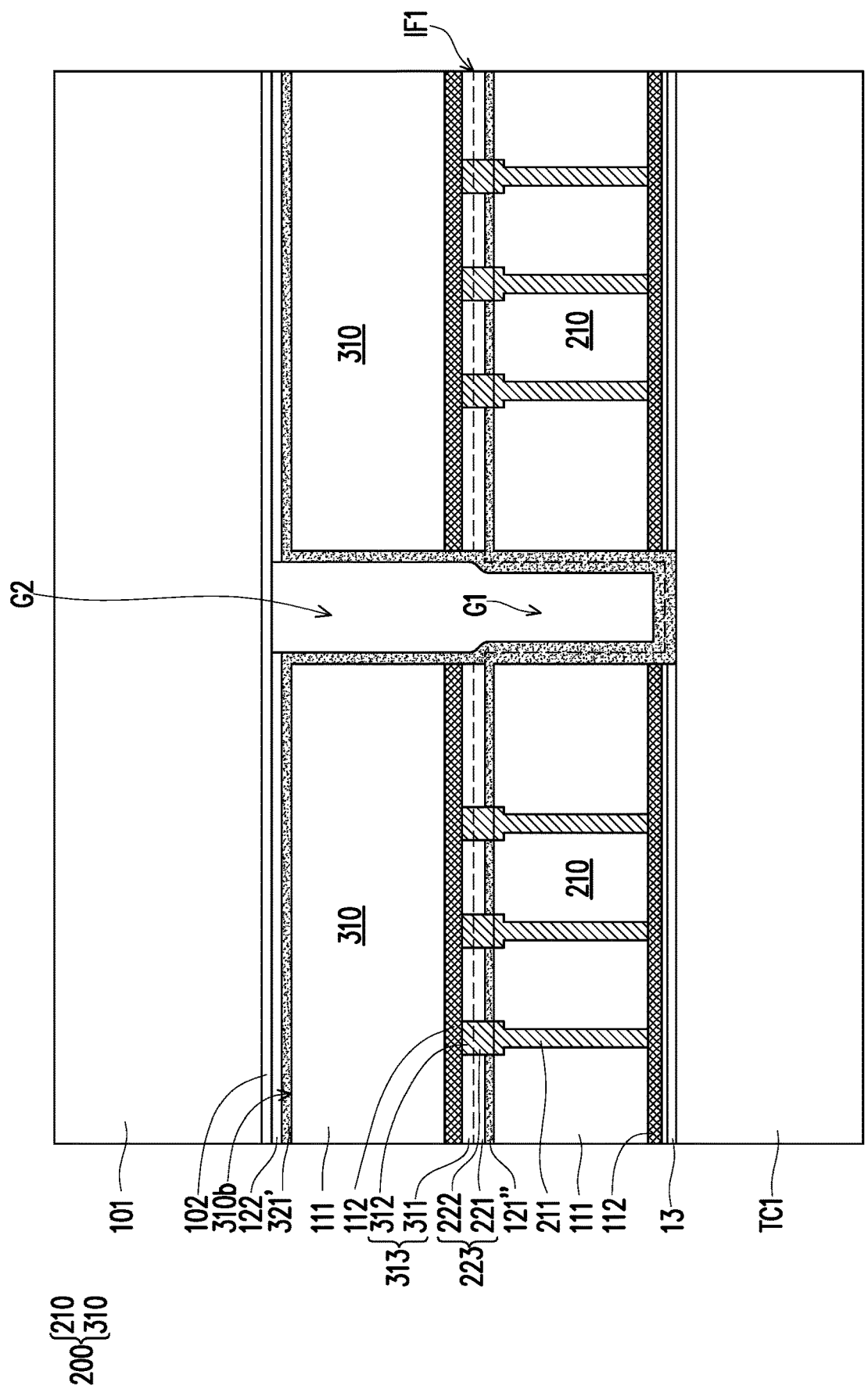

Referring to FIG. 3F, the bonding dielectric layer 122 may be formed on the second protective liner material 321' overlying the back sides 310b of the second semiconductor dies 310. Next, the support substrate 101 may be attached to the second semiconductor dies 310 through the bonding dielectric layers 122 and 102. The gaps G1 and G2 may thus be shielded by the support substrate 101 and the temporary carrier TC1. The support substrate 101 and the bonding dielectric layers 122 and 102 are similar to the support substrate 101 and the bonding dielectric layers 122 and 102 described in FIG. 1D, and thus the detailed descriptions are omitted for the sake of brevity.

Figure 3G:
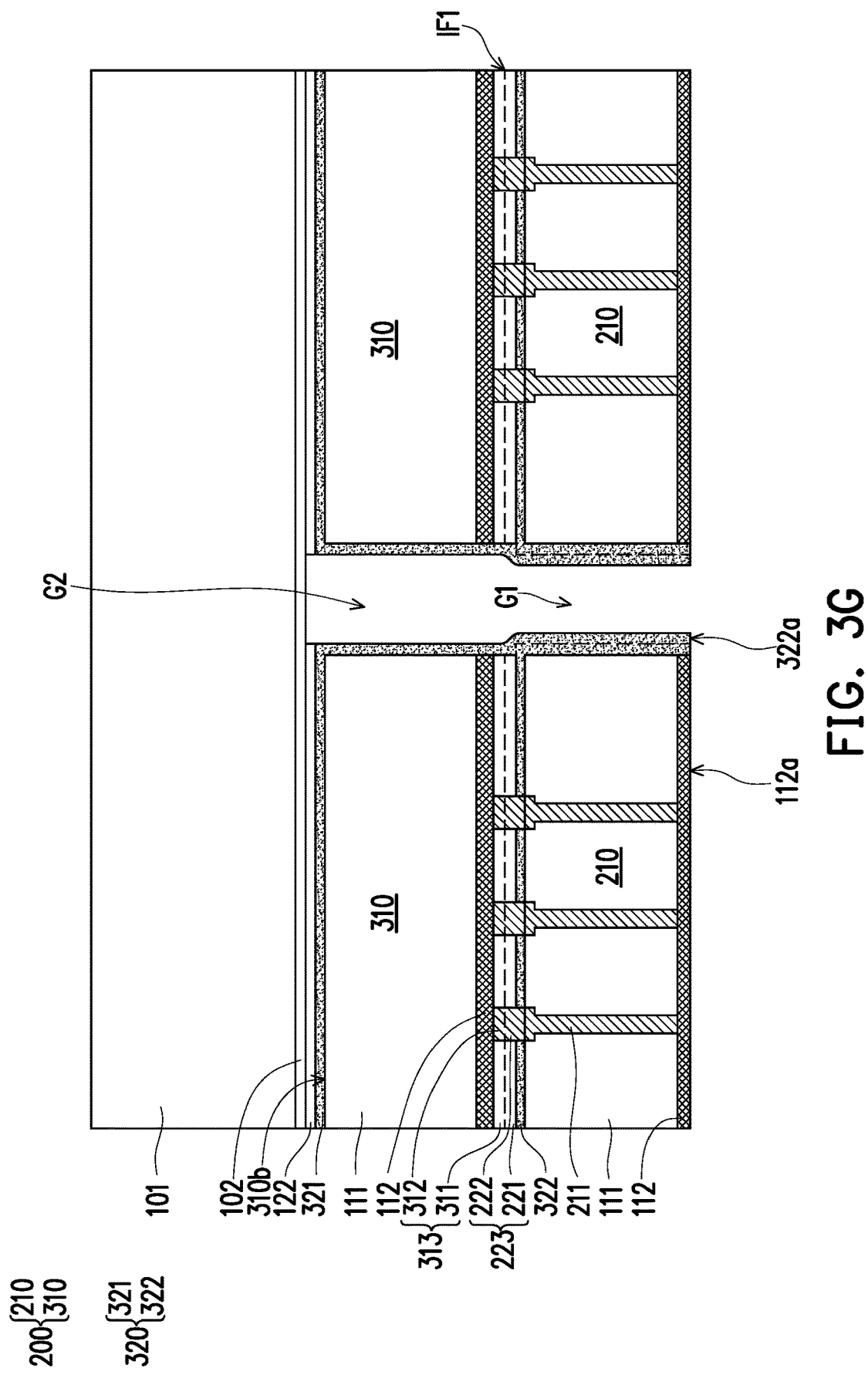

Referring to FIG. 3G and with reference to FIG. 3F, the temporary carrier TC1 may be de-bonded to expose the first semiconductor dies 210. During the removal of the temporary carrier TC1, the sacrificial bonding layer 13 may be removed together with the temporary carrier TC1. In some embodiments, during the removal of the temporary carrier TC1, the horizontal portions of the second protective liner material 321' and the first patterned protective liner 121" that are formed on the temporary carrier TC1 may be removed together with the temporary carrier TC1, and thus the protective liner 320 including the first portion 322 covering the first semiconductor dies 210 and the second portion 321 covering the second semiconductor dies 310 is formed. As mentioned above, the thickness of the second portion 321 may be less than that of the vertical segment of the first portion 322 lining the sidewall of the first semiconductor die 210. After releasing the temporary carrier TC1, the outer surface 112a of the device layer 112 and the outer surface 322a of the first portion 322 of the protective liner 320 may be accessibly revealed. The de-bonding process of the temporary carrier TC1 is similar to the process described in FIG. 1E, and thus the detailed descriptions are omitted for the sake of brevity.

Figure 3H:
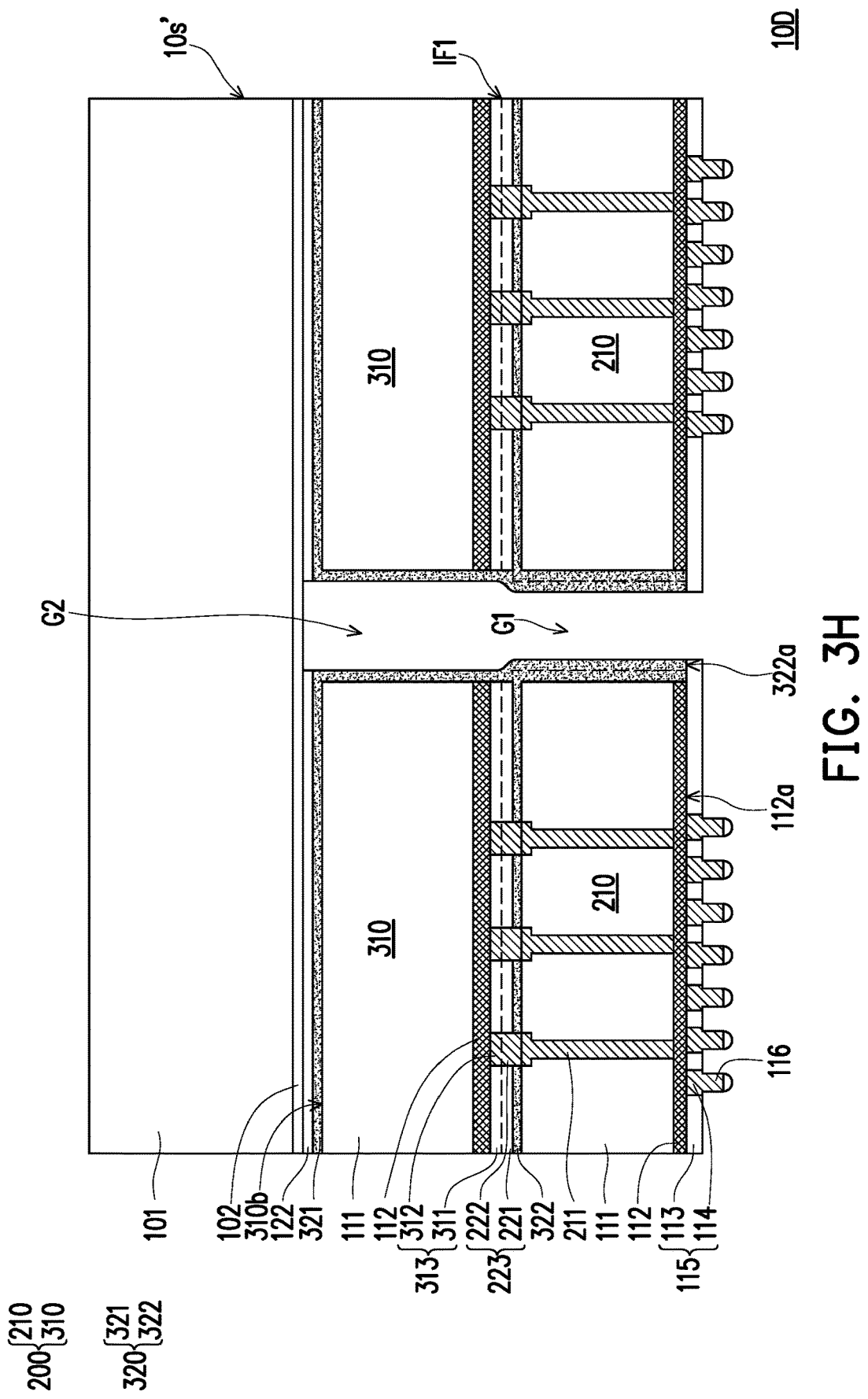

Referring to FIG. 3H, the redistribution structure 115 including the patterned dielectric layer 113 and the patterned conductive layer 114 may be formed underneath the device layer 112 of the respective first semiconductor die 210. The patterned dielectric layer 113 may cover the outer surface 112a of the device layer 112 of each of the semiconductor dies 110 and the outer surface 322a of the first portion 322 of the protective liner 320, and the patterned conductive layer 114 may be formed in the patterned dielectric layer 113 to be electrically coupled to the TSVs 211 through the device layer 112. Subsequently, the conductive bumps 116 may be formed on the patterned conductive layer 114 for further electrical connection. The conductive bumps 116 below one of the first semiconductor die 210 may be electrically coupled to the second semiconductor die 310 stacked upon the one of the first semiconductor die 210 through the second bonding structure 313, the first bonding structure 223, the TSVs 211, and the device layer 112. The redistribution structure 115 and the conductive bumps 116 may be similar to the redistribution structure 115 and the conductive bumps 116 described in FIG. 1F, and thus the detailed descriptions are not repeated for brevity.

In some embodiments, a singulation process is performed to form a plurality of semiconductor structures 10D. The respective semiconductor structure 10D includes a coterminous sidewall 10s', where the coterminous sidewall 10s' includes the sidewalls of the support substrate 101, the bonding dielectric layer 102, the bonding dielectric layer 122, the protective liner 320, the semiconductor substrates 111 of the first and second semiconductor dies 310 and 210, the device layers 112 of the first and second semiconductor dies 310 and 210, the first and second bonding structures 223 and 313, and the patterned dielectric layer 113 of the redistribution structure 115. The semiconductor structure 10D may have the gaps G1 and G2 formed between the adjacent die stacks 200, where the gap is air gap and is free of gap-filling layer formed therein. As mentioned above, by lining the first and second semiconductor dies 210 and 310 with the protective liner 320 having a greater density, the risk of delamination and cracking of the die stack may be reduced or eliminated.

FIGS. 4A-4E are schematic cross-sectional views of various stages of manufacturing a semiconductor structure in accordance with some embodiments. The forming process described in FIGS. 4A-4E is similar to the forming processes described in FIGS. 3A-3H or 1A-1F. The difference includes that the gaps G1 and G2 are filled with the gap-filling layers. It is appreciated that throughout the various views and illustrative embodiments, the identical or similar numbers refer to the identical or similar elements, and the detailed descriptions are not repeated for the sake of brevity.

Figure 4A:
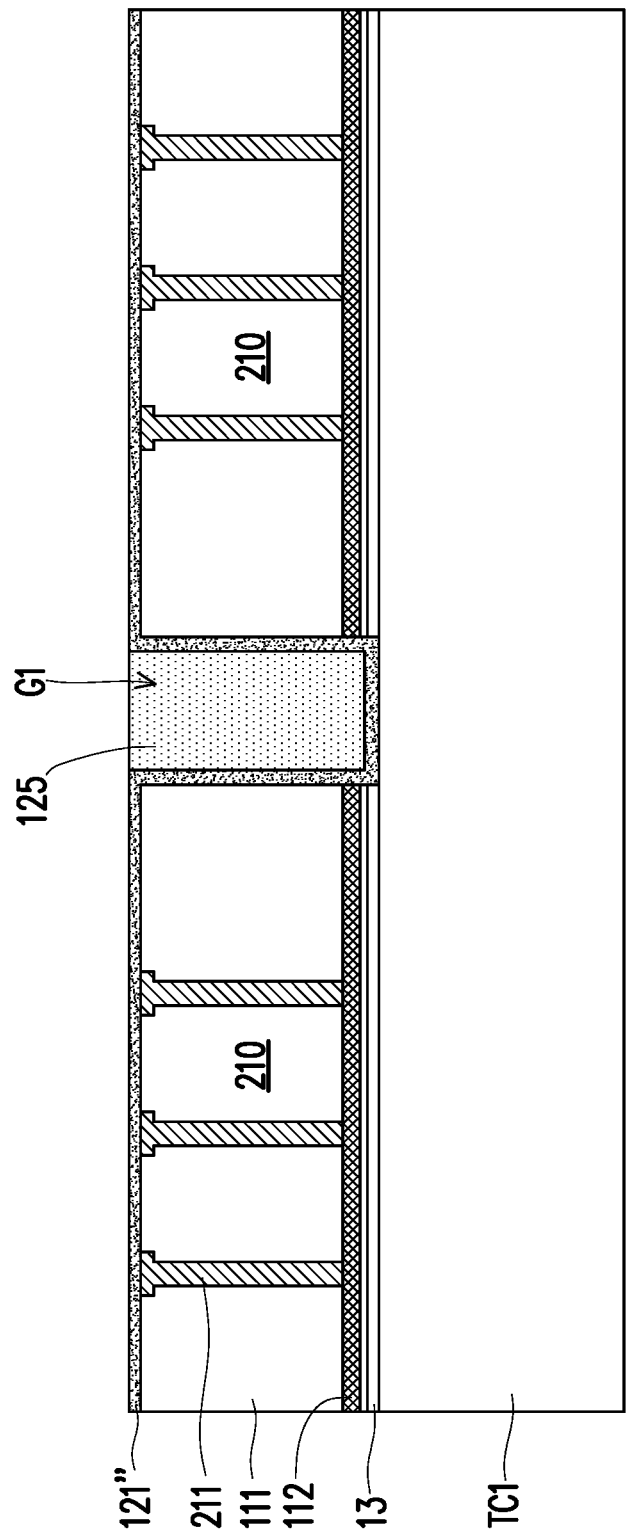
FIGS. 4A-4E are schematic cross-sectional views of various stages of manufacturing a semiconductor structure in accordance with some embodiments.

Referring to FIG. 4A, a first gap-filling layer 125 may be formed in the gap G1 between adjacent first semiconductor dies 210 and covered by the first protective liner material 121'. For example, after forming the first protective liner material 121' as described in FIG. 3B, the first gap-filling layer 125 may be formed in the gap G1 between adjacent first semiconductor dies 210. In alternative embodiments, the first gap-filling layer 125 may be formed in the gap G1 after forming the first bonding structure 223 as shown in FIG. 3C. The material of the first gap-filling layer 125 may be similar to the gap-filling layer 125 described in FIG. 2A, and thus the detailed descriptions are omitted for brevity.

Figure 4B:
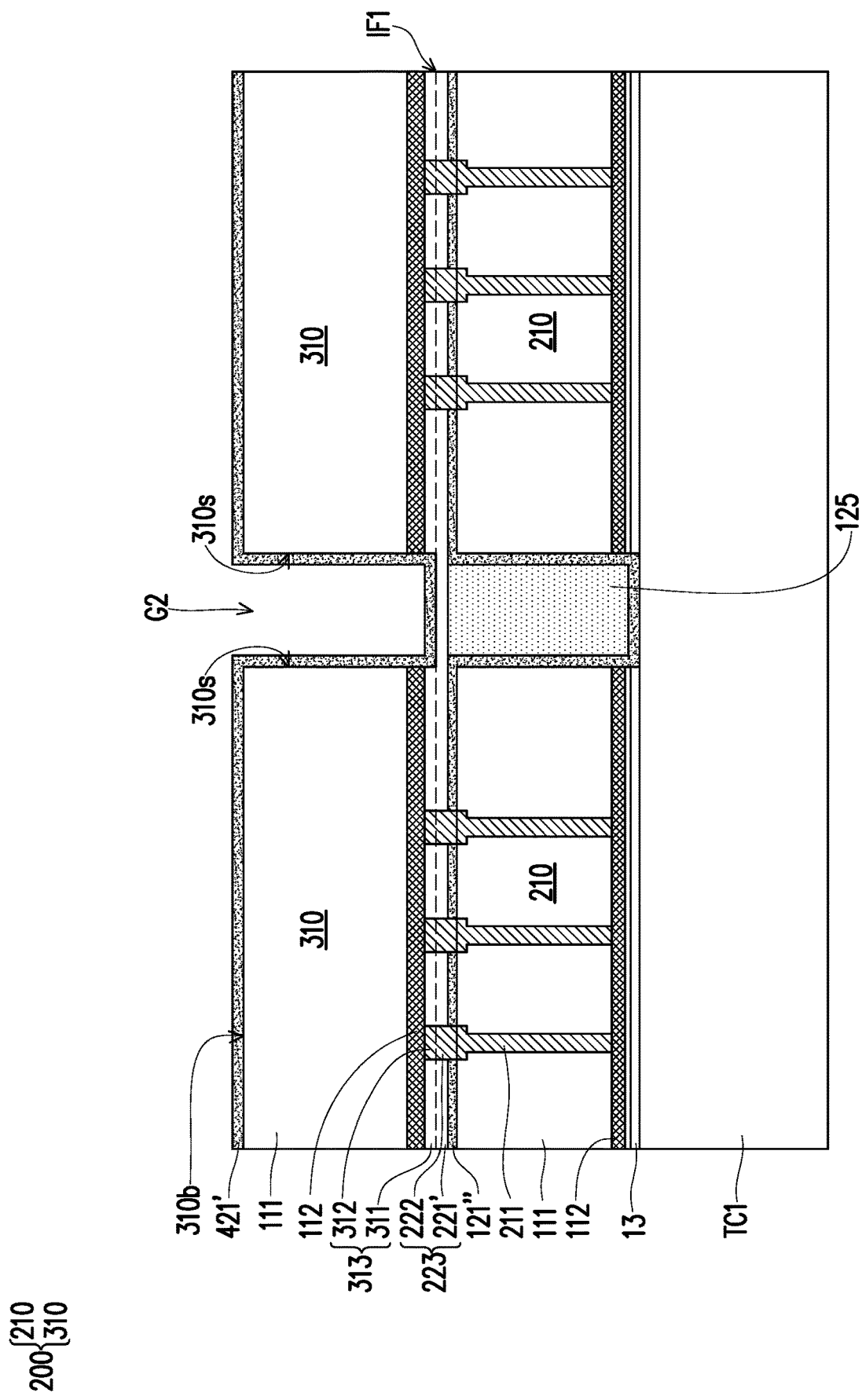

Referring to FIG. 4B, the first bonding structure 223 including the first bonding dielectric layer 221' and the first bonding pads 222 may be formed over the first semiconductor dies 210. The formation of the first bonding structure 223 and the first patterned protective liner 121" may be similar to the process described in FIG. 3C, except that the first bonding dielectric layer 221' is not only formed on the first patterned protective liner 121", but also formed on the first gap-filling layer 125. Next, the second bonding structure 313 of the respective second semiconductor die 310 may be bonded to the first bonding structure 223 of the corresponding first semiconductor die 210, where the second bonding dielectric layer 311 may be bonded to the first bonding dielectric layer 221, and the second bonding pads 312 may be bonded to the first bonding pads 222. The bonding process of the second semiconductor dies 310 may be similar to the process described in FIG. 3D. Subsequently, a second protective liner material 421' may be formed on the back sides 310b of the second semiconductor dies 310 and conformally formed in the gap G2. For example, the second protective liner material 421' in the gap G2 covers the sidewalls 310s of the second semiconductor dies 310 and also covers the first bonding dielectric layer 221' overlying the first gap-filling layer 125. The forming method and the material of the second protective liner material 421' may be similar to those of the first patterned protective liner 121".

Figure 4C:
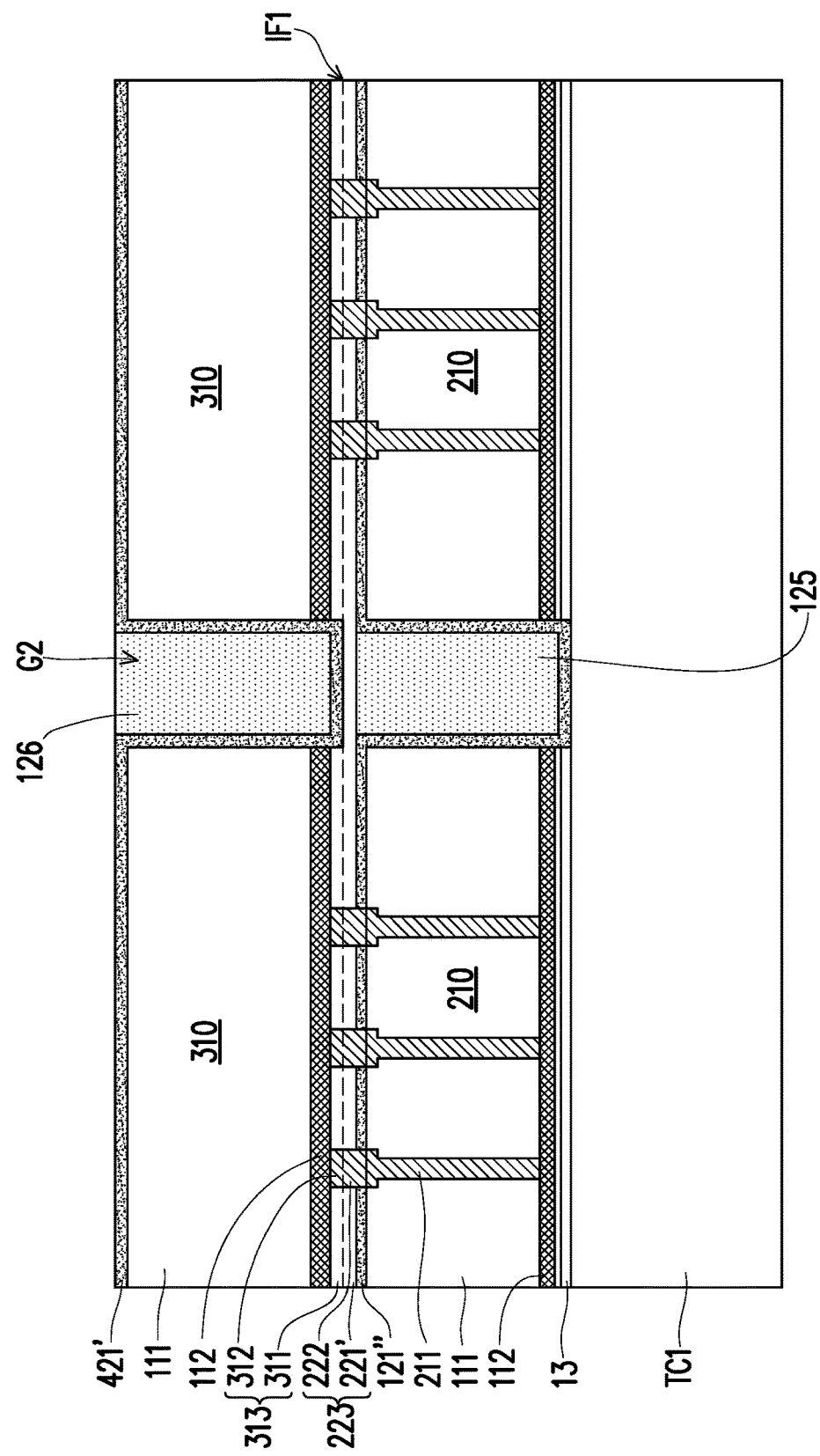
Figure 4D:
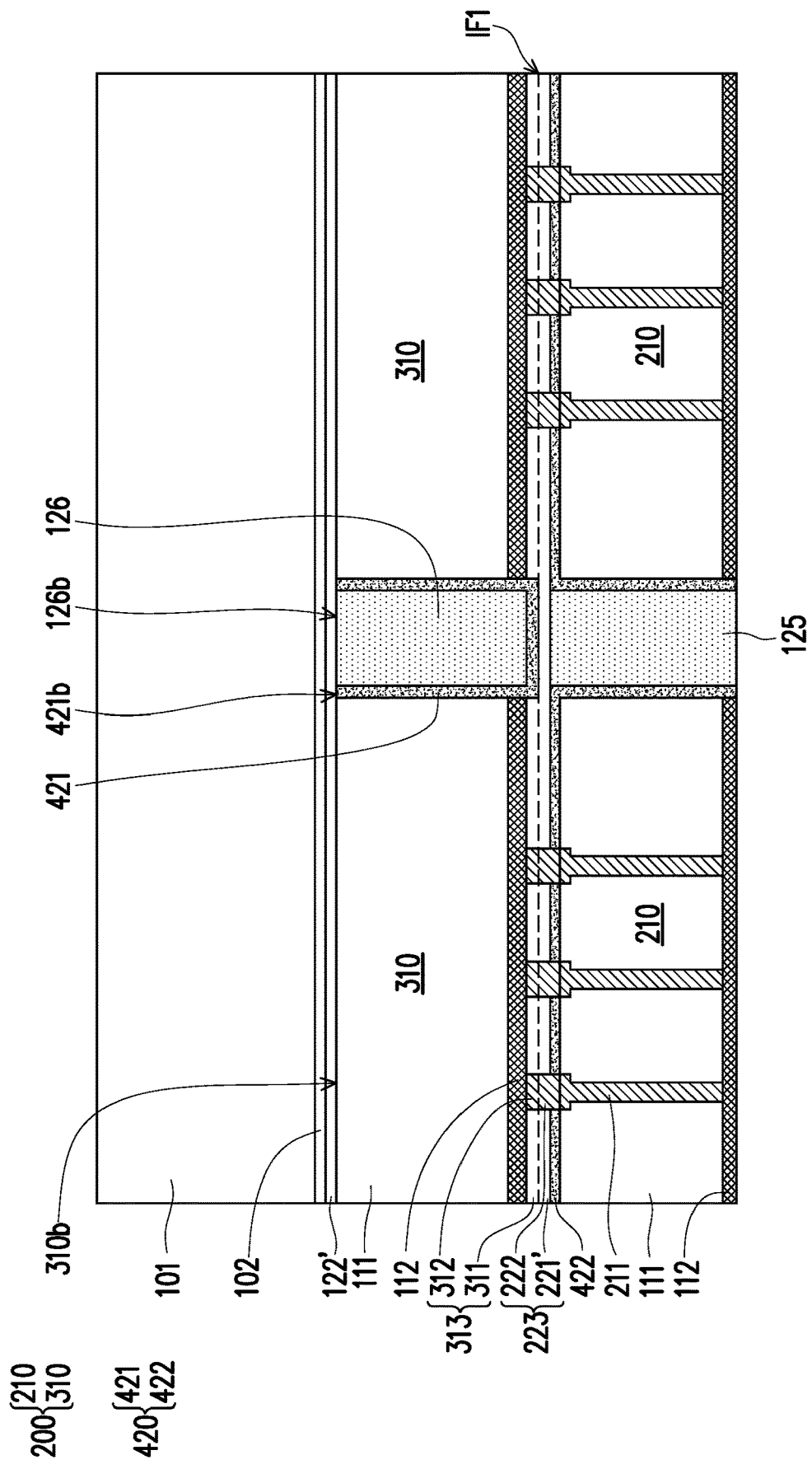

Referring to FIGS. 4C-4D, a second gap-filling layer 126 may be formed in the gap G2 to be covered by the second protective liner material 421'. The material of the second gap-filling layer 126 may be similar to that of the first gap-filling layer 125. A planarization process (e.g., CMP, grinding, etching, a combination thereof, and/or the like) is optionally performed on the second protective liner material 421' to remove horizontal portions of the second protective liner material 421' on the back sides 310b of the second semiconductor dies 310 so as to form the second protective liner 421. For example, the back sides 310b of the second semiconductor dies 310 are substantially leveled (e.g., coplanar) with the upper surface 126b of the second gap-filling layer 126 and the upper surface 421b of the second protective liner 421. Next, the bonding dielectric layer 122' is formed on the back sides 310b of the second semiconductor dies 310 and may also be formed on the upper surface 126b of the second gap-filling layer 126 and the upper surface 421b of the second protective liner 421. Alternatively, the planarization process is omitted, and the bonding dielectric layer 122' is formed on the second protective liner material 421'.

Next, the support substrate 101 may be attached to the second semiconductor dies 310 through the bonding dielectric layers 122 and 102. The support substrate 101 and the bonding dielectric layers 122' and 102 are similar to the support substrate 101 and the bonding dielectric layers 122' and 102 described in FIG. 2A, and thus the detailed descriptions are omitted for the sake of brevity. Once the support substrate 101 is attached to the second semiconductor dies 310, the temporary carrier TC1 may be de-bonded from the first semiconductor dies 210. The de-bonding process of the temporary carrier TC1 may be similar to the process described in FIG. 1E. For example, during the de-bonding of the temporary carrier TC1, the sacrificial bonding layer 13 may be removed together with the temporary carrier TC1, and the horizontal portion of the first patterned protective liner 121" formed on the temporary carrier TC1 may also be removed together with the temporary carrier TC1 to form the first protective liner 422. The first protective liner 422 and the second protective liner 421 may be fully separated and may be collectively viewed as the protective liner 420 lining the die stack 200. After the de-bonding of the temporary carrier TC1, the device layers 112 of the first semiconductor dies 110, the first protective liner 422, and the first gap-filling layer 125 may be accessibly revealed.

Figure 4E:
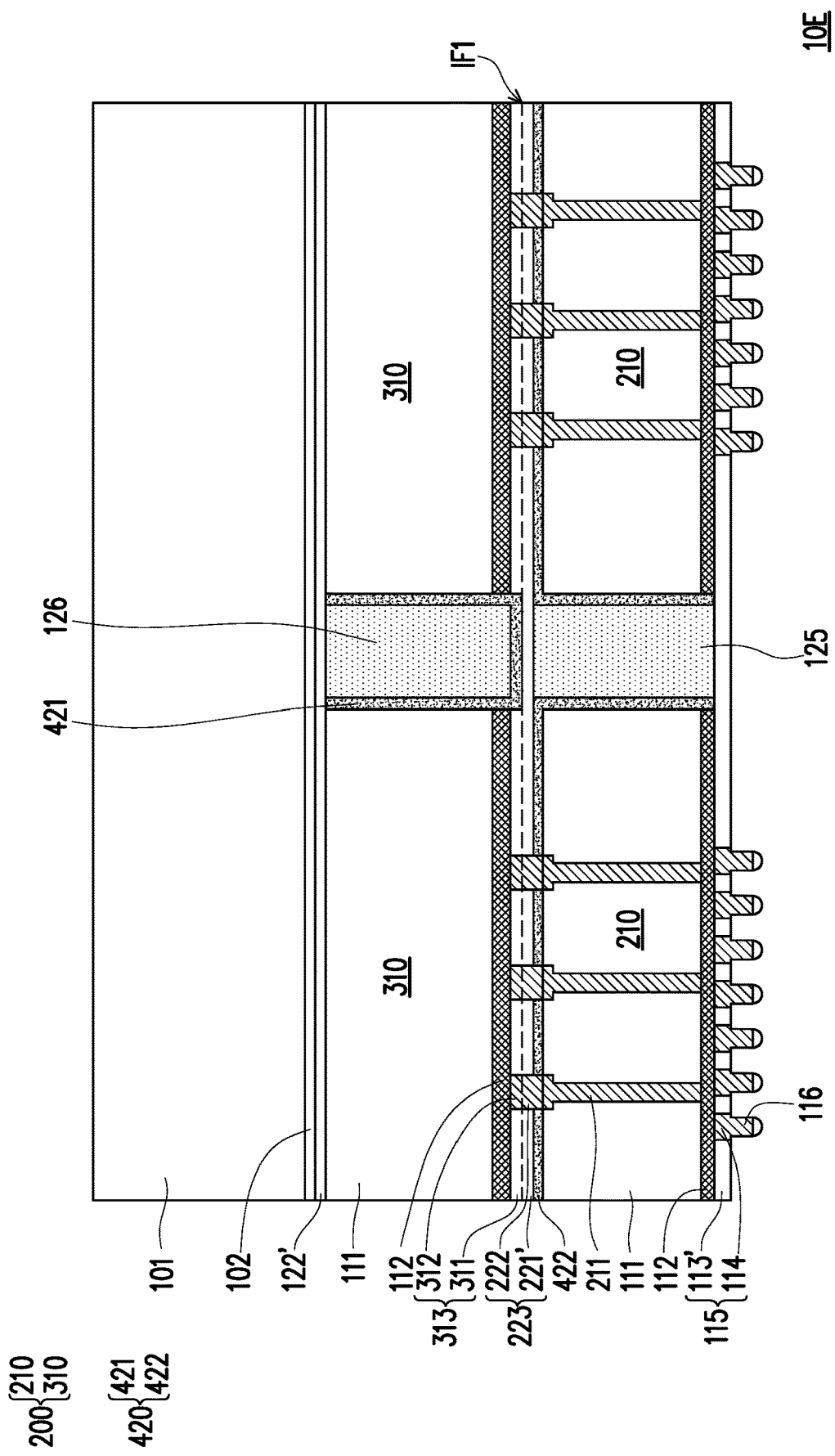

Referring to FIG. 4E, the redistribution structure 115 including the patterned dielectric layer 113 and the patterned conductive layer 114 may be formed underneath the device layers 112 of the first semiconductor dies 210. The patterned dielectric layer 113 may cover the device layer 112 of each of the semiconductor dies 110, the first protective liner 422, and the first gap-filling layer 125. The patterned conductive layer 114 may be formed in the patterned dielectric layer 113 to be electrically coupled to the TSVs 211 through the device layer 112. Subsequently, the conductive bumps 116 may be formed on the patterned conductive layer 114 for further electrical connection. The redistribution structure 115 and the conductive bumps 116 may be similar to the redistribution structure 115 and the conductive bumps 116 described in FIG. 1F, and thus the detailed descriptions are not repeated for brevity. Afterwards, a singulation process may be performed to form a plurality of semiconductor structures 10E.

Figure 5A:
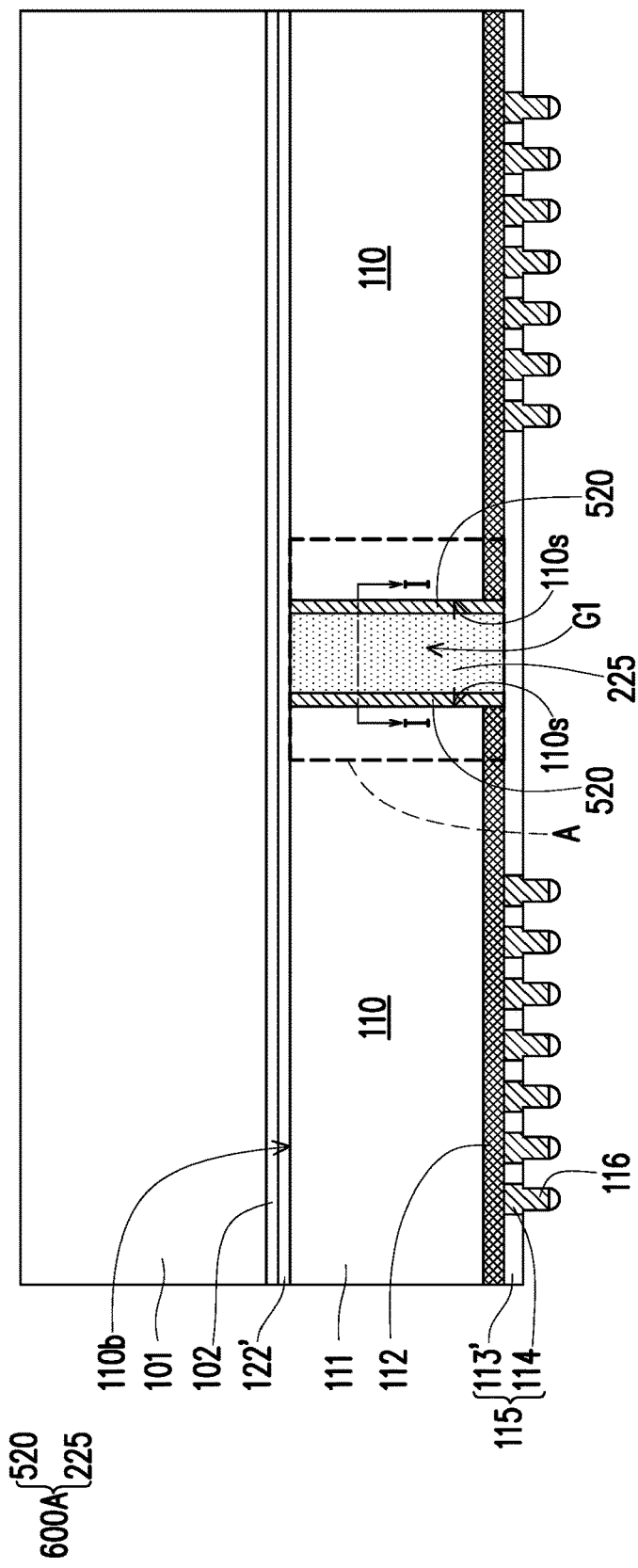
FIGS. 5A and 5B are schematic cross-sectional views of variations of a semiconductor structure in accordance with some embodiments.
Figure 5B:
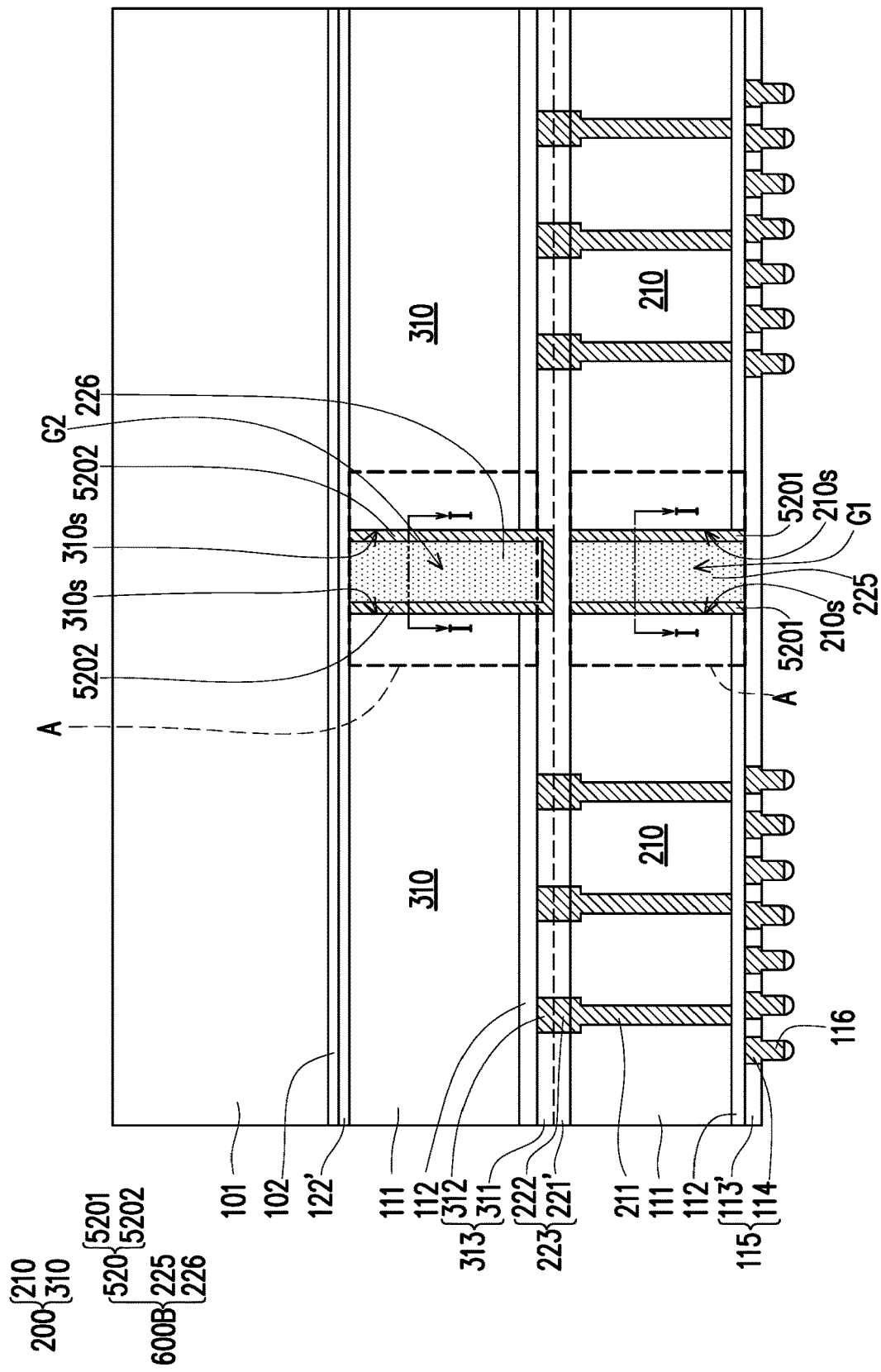
Figure 6A:
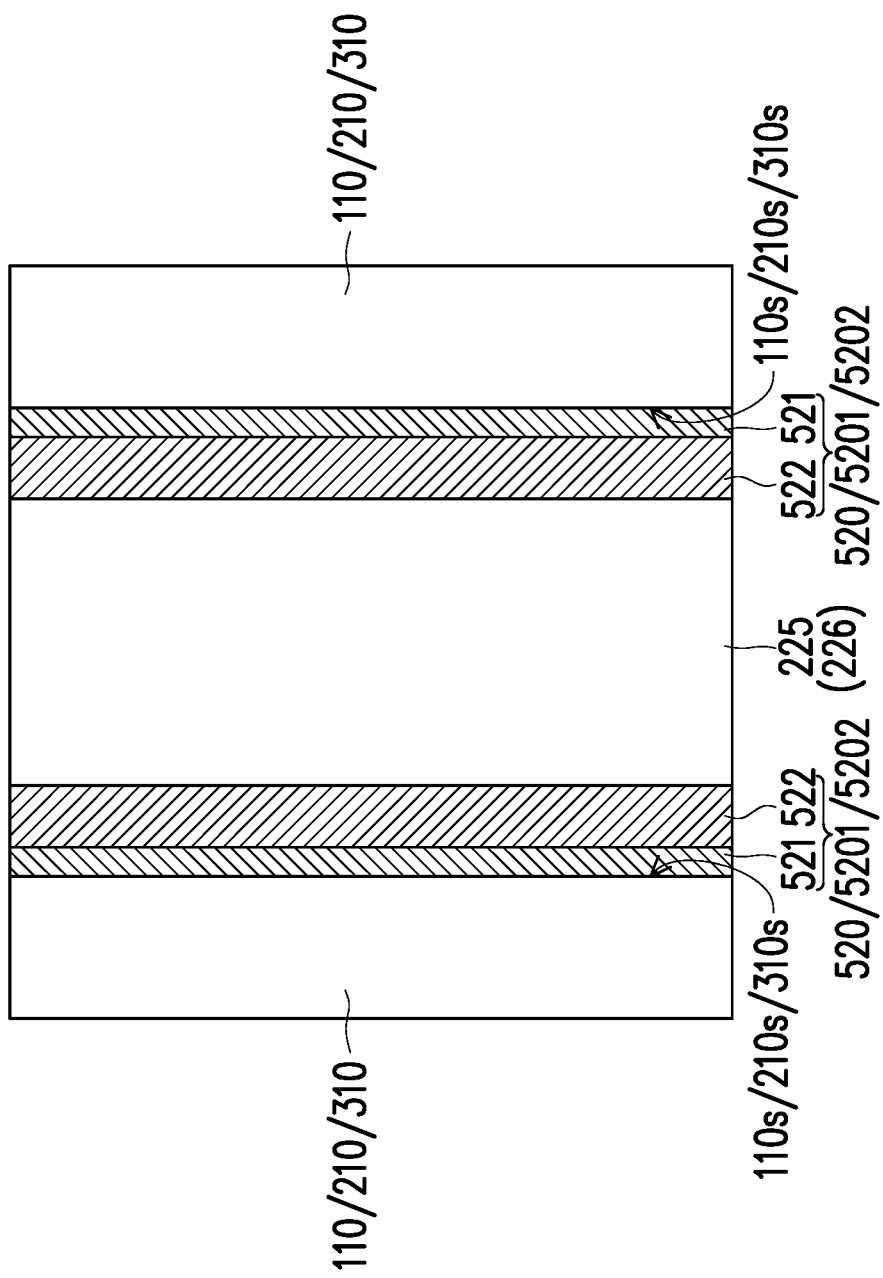
FIGS. 6A and 6B are schematic top views taken along line I-I of FIGS. 5A-5B in accordance with some embodiments.
Figure 6B:
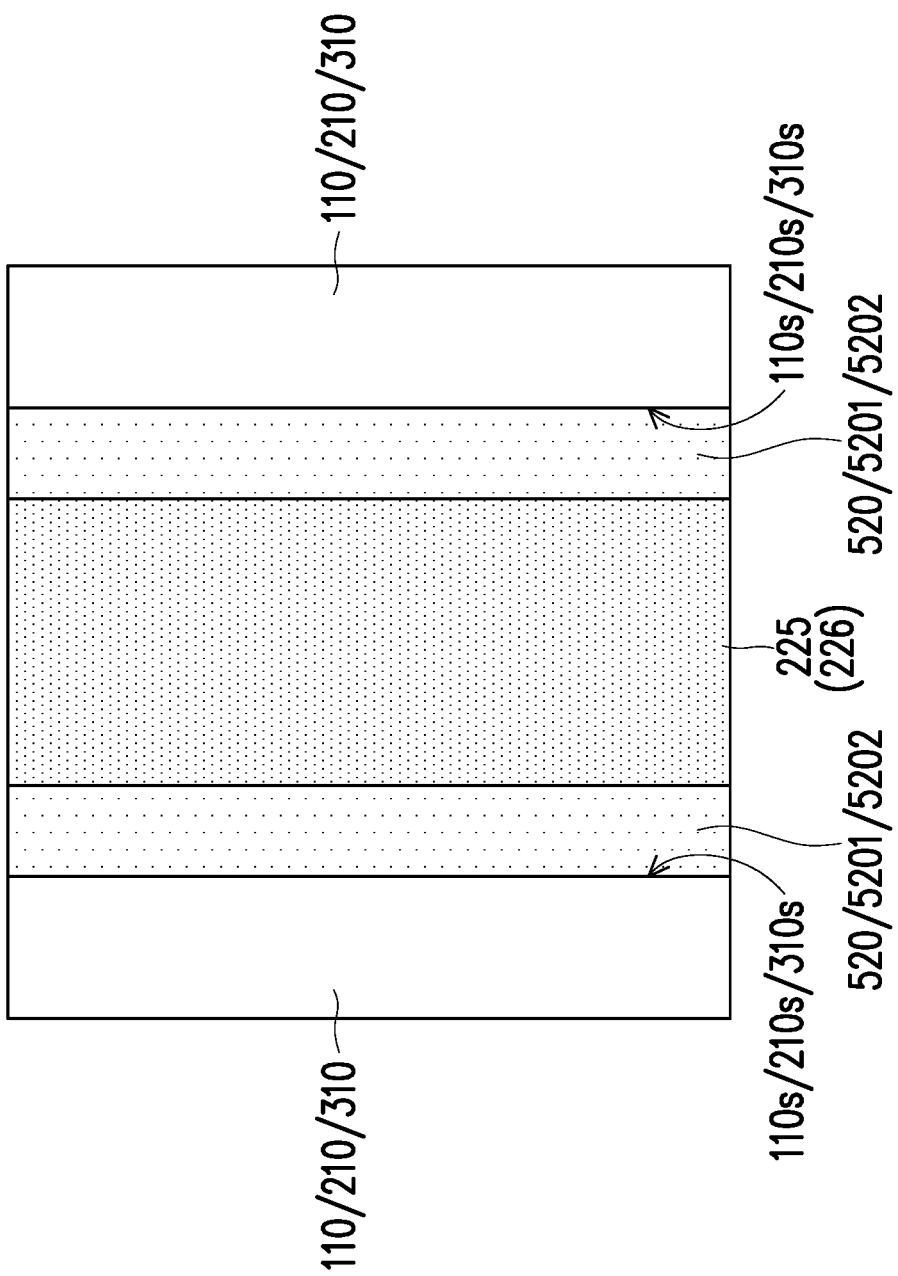

FIGS. 5A and 5B are schematic cross-sectional views of variations of a semiconductor structure and FIGS. 6A and 6B are schematic top views taken along line I-I of FIGS. 5A-5B, in accordance with some embodiments. Throughout the various views and illustrative embodiments, the identical or similar numbers refer to the identical or similar elements.

Referring to FIG. 5A and with reference to FIG. 2B, the formation of the semiconductor structure 10F is similar to the formation of the semiconductor structure 10C, and thus the detailed descriptions are not repeated for brevity. The difference between the semiconductor structures 10F and 10C includes that the protective liner 121 is replaced with a protective liner 520, and the gap-filling layer 125 is replaced with a gap-filling layer 225. The protective liner 520 and the gap-filling layer 225 that are interposed between the semiconductor dies may be collectively viewed as a composition structure 600A. For example, the protective liner 520 is formed on the sidewall 110s of each of the semiconductor dies 110 and does not extend to cover the back surfaces 110b of the semiconductor dies 110. The protective liner 520 may include a single layer or may include multiple sublayers. The protective liner 520 may include conductive material(s) and/or dielectric material(s). The details of the protective liner 520 will be described later in accompanying with FIGS. 6A-6B and FIGS. 7A-7E.

The gap-filling layer 225 may be laterally covered by the protective liner 520. The material of the gap-filling layer 225 of the semiconductor structure 10F is different from the material of the gap-filling layer 125 of the semiconductor structure 10C. In some embodiments, the gap-filling layer 225 may include silicon oxide, silicon nitride, tetraethoxysilane (TEOS), and may be formed through CVD, PECVD, or the like. In some embodiments, the gap-filling layer 225 may be referred to as "gap fill oxide". Other suitable insulating material that can provide a degree of protection for the semiconductor dies 110 may be used to form the gap-filling layer 225.

Referring to FIG. 5B and with reference to FIG. 4E, the formation of the semiconductor structure 10G is similar to the formation of the semiconductor structure 10E, and thus the detailed descriptions are not repeated for brevity. The difference between the semiconductor structures 10G and 10E includes that the protective liner 420 is replaced with a protective liner 520, and the first gap-filling layer 125 and the second gap-filling layer 126 are respectively replaced with a first gap-filling layer 225 and a second gap-filling layer 226. The protective liner 520, the first gap-filling layer 225, and the second gap-filling layer 226 that are interposed between the semiconductor dies may be collectively viewed as a composition structure 600B. The first gap-filling layer 225 is similar to the first gap-filling layer 225 described in FIG. 5A, and the second gap-filling layer 226 may have the same/similar material(s) as the first gap-filling layer 225.

In the illustrated embodiment, the protective liner 520 includes a first protective liner 5201 and a second protective liner 5202, where the first protective liner 5201 lining at least one sidewall 210s of each of the first semiconductor dies 210 is formed in the first gap G1, and the second protective liner 5201 lining at least one sidewall 310s of each of the second semiconductor dies 310 and overlying the first bonding dielectric layer 221' is formed in the second gap G2. The materials of the first protective liner 5201 and the second protective liner 5202 may include conductive material(s) or polymeric material(s). The first protective liner 5201 and the second protective liner 5202 may be of the same material or include different materials, depending on product requirements. The details of the protective liner 520 including the first protective liner 5201 and the second protective liner 5202 will be described later in accompanying with FIGS. 6A-6B and FIGS. 7A-7E.

Referring to FIG. 6A, the protective liner 520 includes a seed layer 521 and a metallic layer 522 lining the seed layer 521. In some embodiments, the seed layer 521 is a metal layer, which may be a single layer or a composite layer including sub-layers formed of different materials. For example, the seed layer 521 includes a titanium layer and a copper layer over the titanium layer. The metallic layer 522 may include copper, titanium, tungsten, aluminum, metal alloy, and/or the like, and may be formed by plating, such as electroplating or electroless plating, or the like. In the embodiment illustrated in FIGS. 5A and 6A, the seed layer 521 is directly formed on the sidewall 110s of the respective first semiconductor die 110, the metallic layer 522 is formed adjacent to the seed layer 521, and the gap-filling layer 225 may be laterally interposed between the metallic layers 522.

In the embodiment illustrated in FIGS. 5B and 6A, the first protective liner 5201 (or the second protective liner 5202) includes the seed layer 521 and the metallic layer 522, where the seed layer 521 is directly formed on the sidewall 210s of the respective first semiconductor die 210 (or the sidewall 310s of the respective second semiconductor die 310), the metallic layer 522 is formed adjacent to the seed layer 521, and the gap-filling layer 225 (or 226) may be laterally interposed between the metallic layers 522. It is worth to mention that in the embodiment illustrated in FIGS. 5B and 6A, the seed layer 521 of the second protective liner 5202 may cover the sidewall 310s of the respective second semiconductor die 310 and also extend downward to cover the sidewall of the second bonding dielectric layer 311 and further overlie the first bonding dielectric layer 221'.

Referring to FIG. 6B, the protective liner 520 includes polymeric material with low outgassing rate. The protective liner 520 (and/or gap-filling layer 225/226; i.e. gap-fill oxide) may have a material having high thermal tolerance with high glass transition temperature (Tg) (e.g., at least 280° C. or above) to withstand the high process/operation temperatures. The material of the protective liner 520 is different from that of the gap-filling layer 225 (or 226; i.e. gap-fill oxide). For example, the glass transition temperature (Tg) of the protective liner 520 may be higher than that of the gap-filling layer 225 (or 226) at a same condition. The outgassing rate of the protective liner 520 may be lower than that of the gap-filling layer 225 (or 226) at a same condition. The protective liner 520 may exhibit improved damage tolerance and crack propagation resistance. If the semiconductor structure warps and cracks are formed in the gap-filling layer 225 (or 226), the protective liner 520 may prevent the cracks from propagating into the respective semiconductor dies. In the embodiment illustrated in FIGS. 5A and 6B, the protective liner 520 is directly formed on the sidewall 110s of the respective first semiconductor die 110, and the gap-filling layer 225 is laterally interposed between the protective liners 520. In the embodiment illustrated in FIGS. 5B and 6B, the first protective liner 5201 and/or the second protective liner 5202 may be or may include the polymeric material as mentioned above.

Figure 7C:
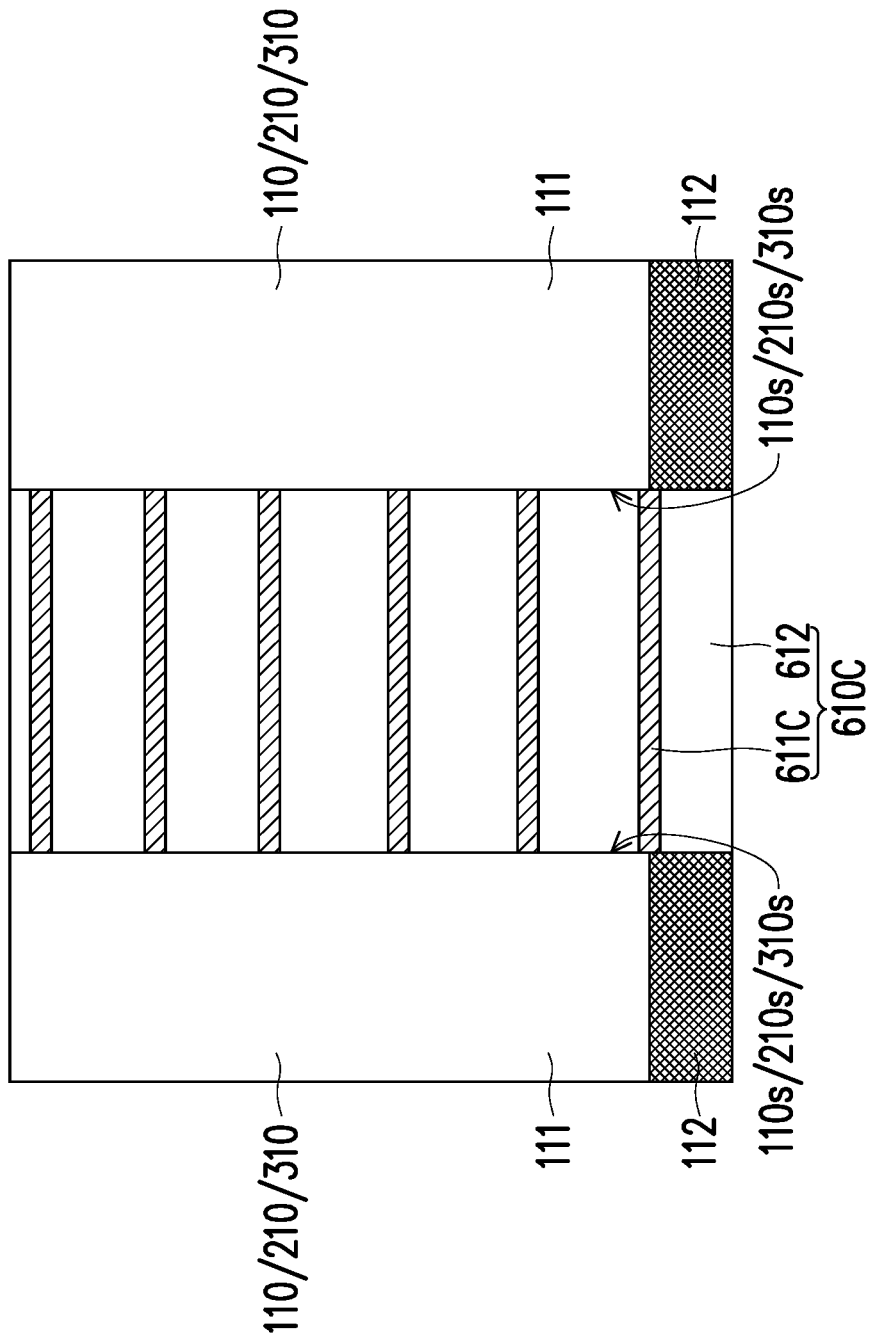
Figure 7D:
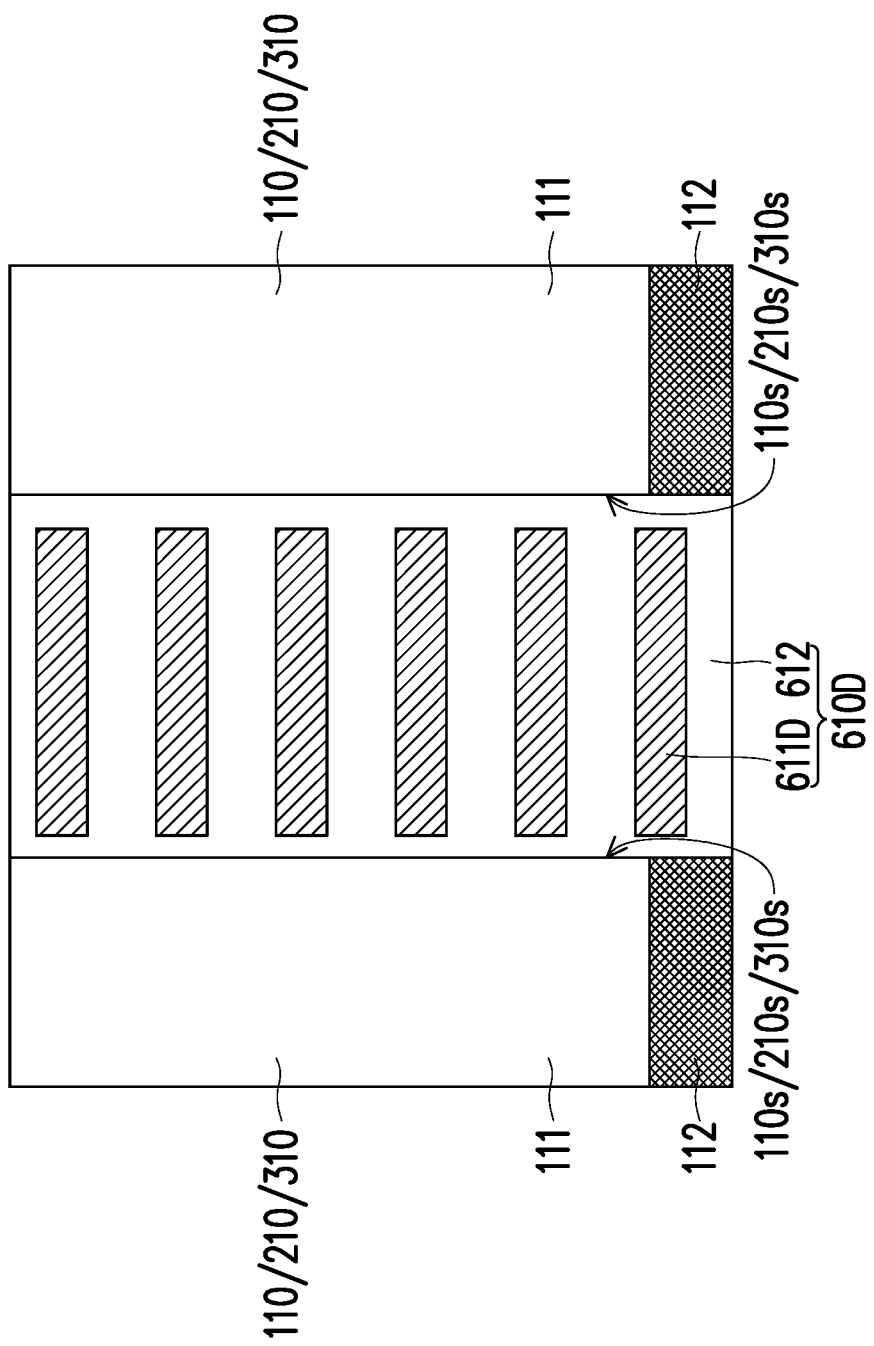
Figure 7E:
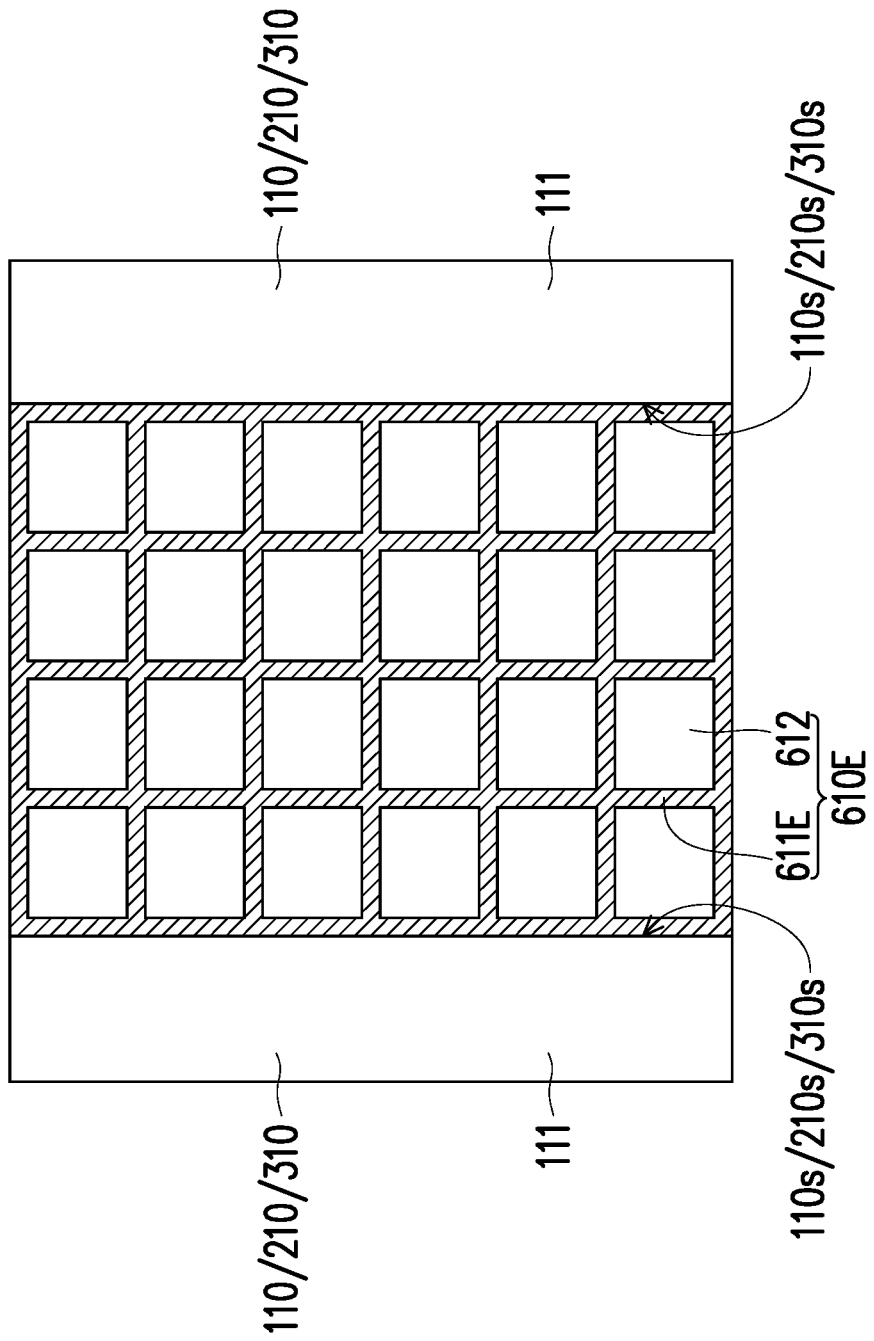
FIG. 7E is a schematic and enlarged top view of a structure in the dashed box A outlined in FIGS. 5A-5B in accordance with some embodiments.

FIGS. 7A-7D are schematic and enlarged cross-sectional views of various structure in the dashed box A outlined in FIGS. 5A-5B and FIG. 7E is a schematic and enlarged top view of a structure in the dashed box A outlined in FIGS. 5A-5B, in accordance with some embodiments. For example, the gap-filling layer and the protective liner shown in FIGS. 5A-5B may be replaced with a composite structure including metallic layer(s) and dielectric layer(s) formed between the adjacent semiconductor dies. It should be noted that the number of the metallic layers and the number of the dielectric layers illustrated herein are merely an example and construe no limitation in the disclosure.

Referring to FIG. 7A and with reference to FIG. 5A, a composite structure 610A is formed between adjacent semiconductor dies 110. The composite structure 610A includes a plurality of metallic layers 611 and a plurality of gap-filling layers 612 alternately arranged along the sidewalls 110s of the semiconductor dies 110. For example, the respective metallic layer 611 is a thin sheet directly lining the sidewalls 110s, and at least one of the metallic layers 611 is attached directly to the sidewall 110s of the semiconductor die 110 to cover the semiconductor substrate 111 and the underlying device layer 112. In some embodiments, the respective metallic layer 611 includes a seed sublayer and a plated metallic sublayer lining the seed sublayer (not individually shown). Alternatively, the respective metallic layer 611 is a single layer. The material of the gap-filling layers 612 may be the same as (or similar to) the material of the gap-filling layer 225 described in the preceding paragraphs. In the embodiment illustrated in FIGS. 7A and 5B, the composite structure 610A is interposed between adjacent first semiconductor dies 210, and another composite structure 610A may be interposed between adjacent second semiconductor dies 310.

Referring to FIG. 7B and with reference to FIG. 5A, a composite structure 610B is formed between adjacent semiconductor dies 110. The composite structure 610B includes the gap-filling layers 612 and a plurality of metallic columns 611B embedded in and laterally covered by the gap-filling layers 612. In the cross-section view, the metallic columns 611B and the gap-filling layers 612 may be alternately arranged along the sidewalls 110s of the semiconductor dies 110. In the embodiment illustrated in FIGS. 7A and 5A, one of the gap-filling layers 612 is directly formed on the sidewall 110s of the semiconductor dies 110, and the respective metallic column 611B is interposed between adjacent gap-filling layers 612. In the embodiment illustrated in FIGS. 7B and 5B, the composite structure 610B is interposed between adjacent first semiconductor dies 210, and another composite structure 610B may be interposed between adjacent second semiconductor dies 310.

Referring to FIG. 7C and with reference to FIG. 5A, a composite structure 610C is formed between adjacent semiconductor dies 110. The composite structure 610C includes a plurality of metallic layers 611C and the gap-filling layers 612 alternately stacked upon one another between the sidewalls 110s of the adjacent semiconductor dies 110. The respective metallic layer 611C may be a sheet of metallic material. For example, each of the metallic layers 611C and the gap-filling layers 612 extends horizontally in the gap between the semiconductor dies 110, and the sidewall of each of the metallic layers 611C and the gap-filling layers 612 may be connected to the sidewalls 110s of the adjacent semiconductor dies 110. In the embodiment illustrated in FIGS. 7C and 5B, the composite structure 610C is interposed between adjacent first semiconductor dies 210, and another composite structure 610C may be interposed between adjacent second semiconductor dies 310.

Referring to FIG. 7D and with reference to FIG. 5A, a composite structure 610D is formed between adjacent semiconductor dies 110. The composite structure 610D includes a plurality of metallic bars 611D embedded in and wrapped by the gap-filling layers 612, where the metallic bars 611D are alternately stacked upon one another between the sidewalls 110s of the adjacent semiconductor dies 110 and may be separated by the gap-filling layers 612. For example, each of the metallic bars 611D extends horizontally in the gap between the semiconductor dies 110, and the sidewalls 110s of the adjacent semiconductor dies 110 are covered by the gap-filling layers 612. In the embodiment illustrated in FIGS. 7D and 5B, the composite structure 610D is interposed between adjacent first semiconductor dies 210, and another composite structure 610D may be interposed between adjacent second semiconductor dies 310.

Referring to FIG. 7E and with reference to FIG. 5A, a composite structure 610E is formed between adjacent semiconductor dies 110. In the top view of FIG. 7E, the composite structure 610E includes at least one metallic mesh 611E and a plurality of dielectric layers 612 formed in the holes of the metallic mesh 611E. In some embodiments, the composite structure 610E includes a plurality of metallic meshes 611E stacked upon one another and separated by the dielectric layers 612. For example, the metallic mesh 611E is in direct contact with the sidewalls 110s of the semiconductor dies 110. In the embodiment illustrated in FIGS. 7E and 5B, the composite structure 610E is interposed between adjacent first semiconductor dies 210, and another composite structure 610E may be interposed between adjacent second semiconductor dies 310.

Figure 8A:
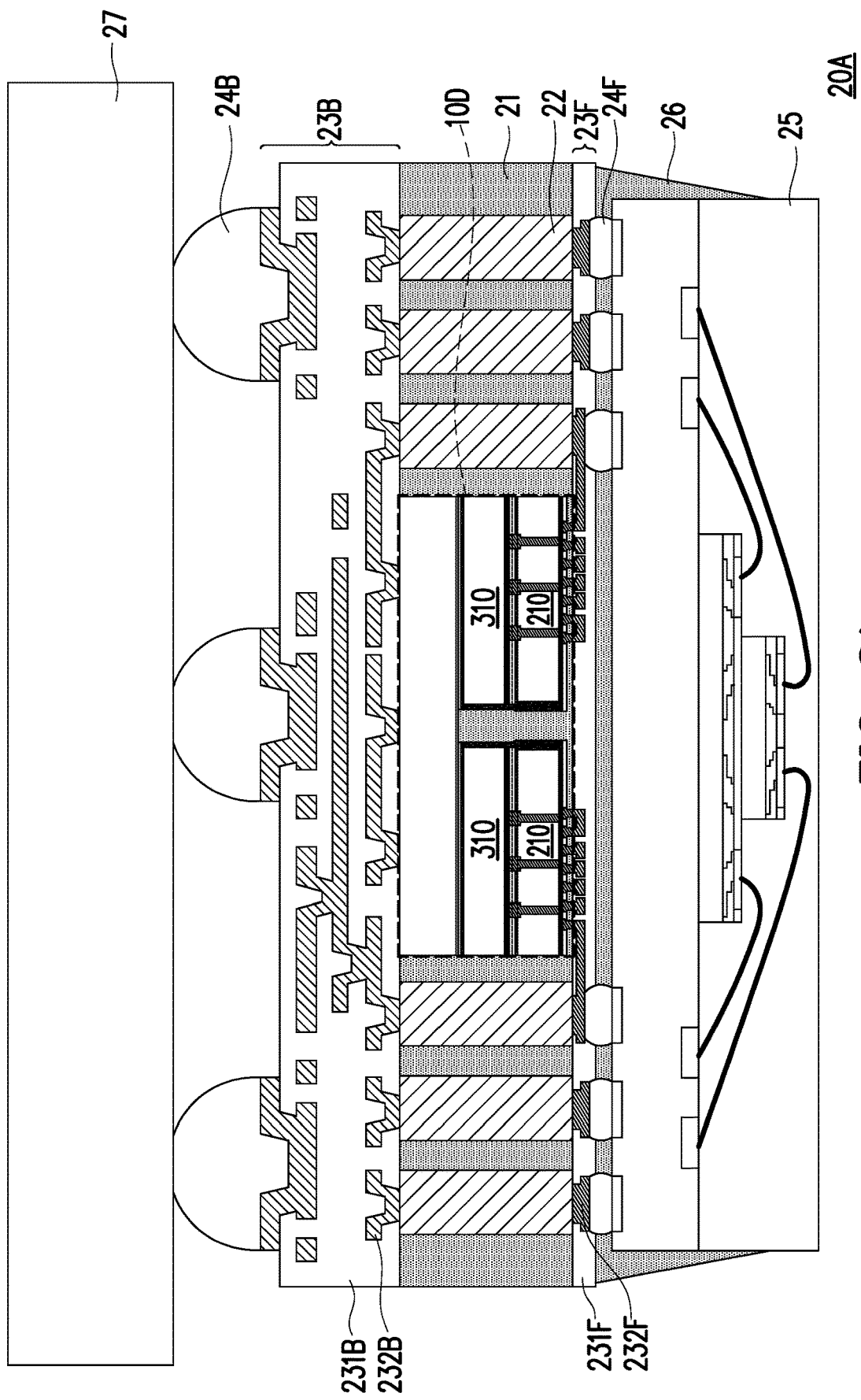
FIGS. 8A and 8B are schematic cross-sectional views of variations of a semiconductor package in accordance with some embodiments.
Figure 8B:
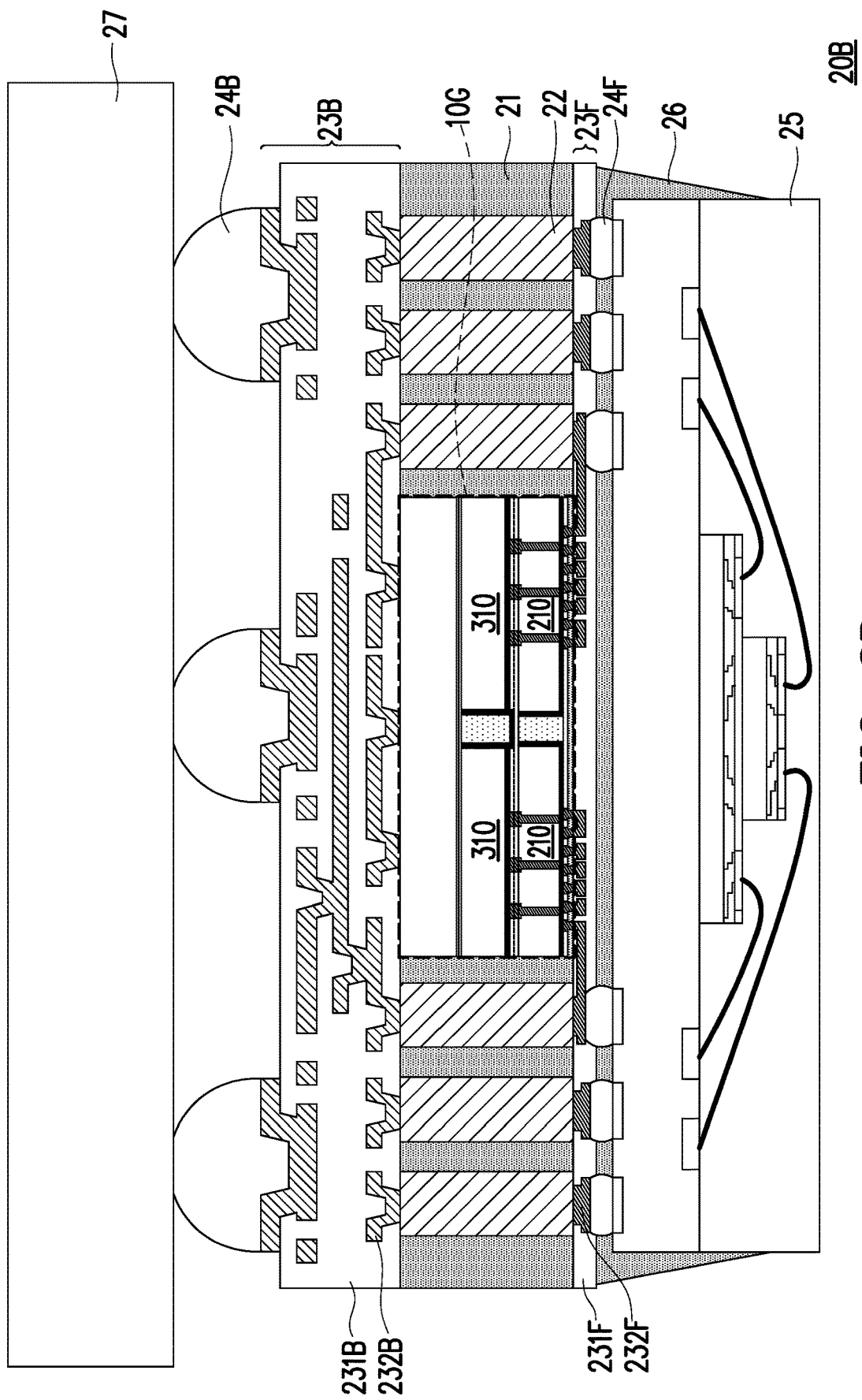

FIGS. 8A and 8B are schematic cross-sectional views of variations of a semiconductor package in accordance with some embodiments. Any suitable packaging techniques may be used to form the semiconductor package 20A (or 20B), which are not limited in the disclosure. For example, the semiconductor package 20A (or 20B) is formed using a wafer level packaging (WLP), an integrated fan-out (InFO) packaging process, a chip-on-wafer-on-substrate (CoWoS) process, a chip-on-chip-on-substrate (CoCoS) process, etc. The semiconductor package 20A (or 20B) may be a part of an electronic system for such as computers (e.g., high-performance computer), computational devices used in conjunction with an artificial intelligence system, wireless communication devices, computer-related peripherals, entertainment devices, etc. It should be noted that other electronic applications are also possible. Throughout the various views and illustrative embodiments, the identical or similar numbers refer to the identical or similar elements.

Referring to FIG. 8A and with reference to FIG. 3H, the semiconductor package 20A includes the semiconductor structure 10D, an insulating encapsulation 21 laterally covering the semiconductor structure 10D and extending to fill the gaps G1 and G2 of the semiconductor structure 10D, through interlayer vias (TIVs) 22 disposed next to the semiconductor structure 10D and penetrating through the insulating encapsulation 21, a front-side redistribution structure 23F disposed on the front side of the semiconductor structure 10D and extending to cover the insulating encapsulation 21 and the TIVs 22, a back-side redistribution structure 23B disposed on the back side of the semiconductor structure 10D and extending to cover the insulating encapsulation 21 and the TIVs 22, a plurality of front-side terminals 24F disposed on the front-side redistribution structure 23F, a plurality of back-side terminals 24B disposed on the back-side redistribution structure 23B. The side where the conductive bumps 116 are distributed on is viewed as the front side of the semiconductor structure 10D, and the opposing side where the support substrate 101 is disposed on is viewed as the back side of the semiconductor structure 10D.

The insulating encapsulation 21 may be a molding compound, epoxy, or the like. For example, the insulating encapsulation 21 laterally covers each of the conductive bumps 116 of the semiconductor structure 10D and fills the gaps G1 and G2 to be laterally covered by the protective liner 320. The insulating encapsulation 21 extending into the gaps G1 and G2 may be in direct contact with the support substrate 101. The front-side redistribution structure 23F may include a patterned dielectric layer 231F and a patterned conductive layer 232F embedded in the patterned dielectric layer 231F, where the patterned conductive layer 232F including conductive lines, conductive pads, conductive vias, and/or the like, may be electrically coupled to the TIVs 22 and the conductive bumps 116.

The back-side redistribution structure 23B may include a patterned dielectric layer 231B and a patterned conductive layer 232B embedded in the patterned dielectric layer 231B, where the patterned conductive layer 232B including conductive lines, conductive pads, conductive vias, and/or the like, may be electrically coupled to the TIVs 22. In some embodiments, the dimension and the spacing of the front-side terminals 24F are less than those of the back-side terminals 24B. The front-side terminals 24F and the back-side terminals 24B may include a conductive material such as solder, copper, aluminum, gold, nickel, silver, palladium, tin, the like, or a combination thereof, and may be or may include ball grid array (BGA) terminals, solder balls, controlled collapse chip connection (C4) bumps, micro bumps, electroless nickel-electroless palladium-immersion gold technique (ENEPIG) terminals, or the like.

In some embodiments, the semiconductor package 20A further includes a package component 25 coupled to the front-side redistribution structure 23F through the front-side terminals 24F. In some embodiments, the package component 25 may be a memory package including at least one memory die (e.g., dynamic random access memory (DRAM) die, static random access memory (SRAM) die, etc.). The package component 25 may include other type of dies such as logic dies, power management dies, radio frequency dies, a sensor die, micro-electro-mechanical-system (MEMS) dies, the like, or combinations thereof. The die stacks including the first semiconductor dies 210 and the second semiconductor dies 310 may be electrically coupled to the package component 25 through the front-side redistribution structure 23F and the front-side terminals 24F. The semiconductor package 20A may include an underfill layer 26 formed in a gap between the front-side redistribution structure 23F and the package component 25 to laterally surround the front-side terminals 24F. In some embodiments, the underfill layer 26 may extend to cover the sidewalls of the package component 25.

In some embodiments, the semiconductor package 20A further includes a circuit substrate 27 coupled to the back-side redistribution structure 23B through the back-side terminals 24B. The circuit substrate 27 may be or may include a printed circuit board (PCB), a package substrate, a mother board, a system board, and/or the like. The die stacks including the first semiconductor dies 210 and the second semiconductor dies 310 may be electrically coupled to the circuit substrate 27 through the front-side redistribution structure 23F, the TIVs 22, the back-side redistribution structure 23B, and the back-side terminals 24B. The package component 25 may be electrically coupled to the circuit substrate 27 through the front-side terminals 24F, the front-side redistribution structure 23F, the TIVs 22, the back-side redistribution structure 23B, and the back-side terminals 24B. It should be understood that the semiconductor structure 10D in the semiconductor package 20A may be replaced with the semiconductor structure 10A shown in FIG. 1F. In some embodiments, the semiconductor package 20A includes various semiconductor structures (e.g., any combination of 10A-10G) disposed side-by-side and encapsulated by the insulating encapsulation 21.

Referring to FIG. 8B and with reference to FIGS. 5B and 8A, the semiconductor package 20B is similar to the semiconductor package 20A in FIG. 8A, and thus the detailed descriptions are not repeated for the sake of brevity. The difference between the semiconductor structures 20B and 20A is that the semiconductor structure 10D in the semiconductor package 20A is replaced with the semiconductor structure 10G. In the illustrated embodiments, the insulating encapsulation 21 laterally covers the sidewall 10s of the semiconductor structure 10G and extends to underlie the patterned dielectric layer 113 of the redistribution structure 115 and laterally cover the respective conductive bump 116 of the semiconductor structure 10G. It should be understood that the semiconductor structure 10G in the semiconductor package 20B may be replaced with the semiconductor structure 10B shown in FIG. 2A, the semiconductor structure 10C shown in FIG. 2B, the semiconductor structure 10E shown in FIG. 4E, or the semiconductor structure 10F shown in FIG. 5A. In some embodiments, the semiconductor package 20B includes various semiconductor structures (e.g., any combination of 10A-10G) disposed side-by-side and encapsulated by the insulating encapsulation 21.

According to some embodiments, a semiconductor structure includes first semiconductor dies spaced apart from one another, second semiconductor dies stacked upon the first semiconductor dies with a one-to-one correspondence and electrically coupled to the first semiconductor dies, a first composite structure laterally interposed between adjacent two of the first semiconductor dies, a second composite structure laterally interposed between adjacent two of the second semiconductor dies, and a support substrate bonded to the second semiconductor dies and the second composite structure. The first composite structure includes a first material layer adjoining sidewalls of the two of the first semiconductor dies and a second material layer connected to the first material layer, where the first material layer is different from the second material layer. The second composite structure includes a third material layer adjoining sidewalls of the two of the second semiconductor dies and a fourth material layer connected to the third material layer, where the third material layer is different from the fourth material layer.

According to some alternative embodiments, a semiconductor structure includes first semiconductor dies spaced apart from one another, a first protective liner, and a support substrate disposed over the first semiconductor dies. Each of the first semiconductor dies includes an active side, a back side opposite to the active side, and a first sidewall and a second sidewall that are connected to the active side and the back side. The first protective liner at least lines the first sidewall of each of the first semiconductor dies. The support substrate includes a sidewall coterminous with a sidewall of the first protective liner and a second sidewall of the respective first semiconductor die.

According to some alternative embodiments, a manufacturing method of a semiconductor structure includes at least the following steps. A first protective material is at least formed on a sidewall of each of first semiconductor dies that are arranged on a temporary carrier. Second semiconductor dies are bonded to the first semiconductor dies with a one-to-one correspondence after forming the first protective material. A second protective material is at least formed on a sidewall of each of the second semiconductor dies, where the second protective material further extends to line the first protective material between adjacent two of the first semiconductor dies. A support substrate is bonded to the second semiconductor dies, where the second protective material is interposed between the support substrate and the second semiconductor dies. The temporary carrier is removed, where a portion of the first protective material and an overlying portion of the second protective material formed on the temporary carrier are removed to respectively form a first protective liner and the second protective liner. A redistribution structure is formed on the active sides of the first semiconductor dies after removing the temporary carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   first semiconductor dies spaced apart from one another;
   second semiconductor dies stacked upon the first semiconductor dies with a one-to-one correspondence and electrically coupled to the first semiconductor dies;
   a first composite structure laterally interposed between adjacent two of the first semiconductor dies, the first composite structure comprising a first protective liner adjoining sidewalls of the two of the first semiconductor dies and a first gap-filling layer connected to the first protective liner, wherein a material of the first protective liner is different from a material of the first gap-filling layer;
   a second composite structure laterally interposed between adjacent two of the second semiconductor dies, the second composite structure comprising a second protective liner adjoining sidewalls of the two of the second semiconductor dies and a second gap-filling layer connected to second protective liner, wherein a material of the second protective liner is different from a material of the second gap-filling layer; and
   a support substrate bonded to the second semiconductor dies and the second composite structure.

2. The semiconductor structure of claim 1, wherein:
   a first bonding structure of each of the first semiconductor dies comprises a first bonding dielectric layer and first bonding pads laterally covered by the first bonding dielectric layer; and
   a second bonding structure of each of the second semiconductor dies comprises a second bonding dielectric layer and second bonding pads laterally covered by the second bonding dielectric layer, wherein the second bonding dielectric layer is bonded to the first bonding dielectric layer, and the second bonding pads are bonded to the first bonding pads, and an interface between the first bonding structure and the second bonding structure is substantially flat.

3. The semiconductor structure of claim 1, wherein a first bonding structure of each of the first semiconductor dies comprises a first bonding dielectric layer and first bonding pads laterally covered by the first bonding dielectric layer, and the first bonding dielectric layer extends to cover the first composite structure.

4. The semiconductor structure of claim 3, wherein the second protective liner of the second composite structure comprises a conductive material lining the sidewalls of the second semiconductor dies and overlying the first bonding dielectric layer which is on the first composite structure.

5. The semiconductor structure of claim 1, wherein the first protective liner of the first composite structure comprises a conductive material, and the first gap-filling layer of the first composite structure comprises a dielectric material.

6. The semiconductor structure of claim 5, wherein the first protective liner of the first composite structure is in direct contact with the sidewalls of the two of the first semiconductor dies.

7. The semiconductor structure of claim 1, wherein the first protective liner of the first composite structure comprises dielectric sublayers, the first gap-filling layer of the first composite structure comprises conductive sublayers, and the dielectric sublayers and the conductive sublayers are stacked upon one another and alternately arranged.

8. The semiconductor structure of claim 1, wherein the first protective liner of the first composite structure comprises a metallic mesh, and the first gap-filling layer of the first composite structure comprises dielectric sublayers disposed in the metallic mesh.

9. The semiconductor structure of claim 1, wherein the first protective liner of the first composite structure comprises a first dielectric material, the first gap-filling layer of the first composite structure comprises a second dielectric material, and the first dielectric material lining the sidewalls of the first semiconductor dies comprises a glass transition temperature higher than a glass transition temperature of the second dielectric material.

10. The semiconductor structure of claim 1, further comprising:
a redistribution structure underlying the first semiconductor dies and the first composite structure, wherein a patterned dielectric layer of the redistribution structure is in direct contact with the first protective liner and the first gap-filling layer of the first composite structure.

11. A semiconductor structure, comprising:
a first lower die and a second lower die laterally offset from the first lower die;
a first upper die and a second upper die laterally offset from the first upper die, the first upper die stacked upon and electrically coupled to the first lower die, and the second upper die stacked upon and electrically coupled to the second lower die;
a lower composite structure laterally between the first and second lower dies, the first composite structure comprising a first protective liner lining inner sidewalls of the first and second lower dies and a first gap-filling layer connected to the first protective liner;
an upper composite structure directly over the lower composite structure, the second composite structure comprising a second protective liner lining inner sidewalls of the first and second upper dies and a second gap-filling layer connected to the second protective liner; and
a support substrate stacked upon the first and second upper dies and the upper composite structure.

12. The semiconductor structure of claim 11, wherein outer sidewalls of the first upper die and the first lower die are substantially coplanar, and outer sidewalls of the second upper die and the second lower die are substantially coplanar.

13. The semiconductor structure of claim 11, wherein the first protective liner of the lower composite structure comprises a conductive material, and the first gap-filling layer of the lower composite structure comprises a dielectric material.

14. The semiconductor structure of claim 11, wherein the second protective liner of the upper composite structure comprises a conductive material and is extended to be disposed directly over the first gap-filling layer.

15. The semiconductor structure of claim 11, wherein a material of the second protective liner is different from a material the second gap-filling layer.

16. A semiconductor structure, comprising:
a first die and a second die laterally distanced from each other by a first gap;
a third die disposed over and electrically coupled to the first die;
a fourth die disposed over the second die, laterally distanced from the third die by a second gap, and electrically coupled to the second die;
a first composite structure connected to the first and second dies, the first composite structure comprising a first protective liner lining the first and second dies and a first gap-filling layer filling the first gap, wherein a material density of the first protective liner is greater than that of the first gap-filling layer; and
a second composite structure connected to the third and fourth dies, the second composite structure comprising a second protective liner lining the third and fourth dies and a second gap-filling layer filling the second gap.

17. The semiconductor structure of claim 16, further comprising:
a support substrate disposed over the third and fourth dies and the second composite structure, the support substrate comprising a sidewall coterminous with sidewalls of the third die, the first protective liner, and the first die.

18. The semiconductor structure of claim 16, wherein the first protective liner comprises a conductive material different from a material of the first gap-filling layer.

19. The semiconductor structure of claim 16, wherein the second protective liner comprises a vertical portion lining sidewalls of the third and fourth dies and a horizontal portion connected to the vertical portion and disposed over the first composite structure.

20. The semiconductor structure of claim 16, wherein the first protective liner comprises a seed material lining the first and second die and a metallic material interposed between the seed material and the first gap-filling layer.

* * * * *